(12) United States Patent
Parkinson et al.

(10) Patent No.: US 11,854,592 B2
(45) Date of Patent: *Dec. 26, 2023

(54) SIGNAL AMPLIFICATION IN MRAM DURING READING, INCLUDING A PAIR OF COMPLEMENTARY TRANSISTORS CONNECTED TO AN ARRAY LINE

(71) Applicant: SanDisk Technologies LLC, Addison, TX (US)

(72) Inventors: Ward Parkinson, Boise, ID (US); James O'Toole, Boise, ID (US); Nathan Franklin, Belmont, CA (US); Thomas Trent, Tucson, AZ (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/828,905

(22) Filed: May 31, 2022

(65) Prior Publication Data

US 2022/0293156 A1    Sep. 15, 2022

Related U.S. Application Data

(63) Continuation of application No. 17/061,636, filed on Oct. 2, 2020, now Pat. No. 11,386,945.

(51) Int. Cl.
*G11C 11/16* (2006.01)
*H10N 50/80* (2023.01)

(52) U.S. Cl.
CPC ........ *G11C 11/1673* (2013.01); *G11C 11/161* (2013.01); *G11C 11/1659* (2013.01); *G11C 11/1675* (2013.01); *H10N 50/80* (2023.02)

(58) Field of Classification Search
None
See application file for complete search history.

(56) References Cited

U.S. PATENT DOCUMENTS

| 5,568,434 A | 10/1996 | Jeon |
| 5,706,226 A | 1/1998 | Chan et al. |
| (Continued) | | |

FOREIGN PATENT DOCUMENTS

| JP | 2010080009 A | 4/2010 |
| JP | 2010152986 A | 7/2010 |
| (Continued) | | |

OTHER PUBLICATIONS

Bishnoi, Rajendra, et al., "Avoiding Unnecessary Write Operations in STT-MRAM for Low Power Implementation," Fifteenth International Symposium on Quality Electronic Design, Mar. 2014, 6 pages.

(Continued)

*Primary Examiner* — J. H. Hur
(74) *Attorney, Agent, or Firm* — Vierra Magen Marcus LLP

(57) ABSTRACT

A control circuit is configured to connect to a cross-point memory array in which each conductive line, such as a bit line or word line, is connected to a transistor pair comprising a pMOSFET in parallel with an nMOSFET. When selecting a memory cell to be read, a voltage of a first conductive line may be pulled up using the pMOSFET in a conductive state while the nMOSFET is in a non-conductive state. Further, when reading the selected memory cell, the parallel nMOSFET of the first conductive line may be in a conductive state.

20 Claims, 21 Drawing Sheets

(56) References Cited

U.S. PATENT DOCUMENTS

| | | |
|---|---|---|
| 5,953,246 A | 9/1999 | Takashima |
| 5,978,279 A | 11/1999 | Park |
| 5,986,938 A | 11/1999 | Jang |
| 6,034,909 A | 3/2000 | Brady |
| 6,037,799 A | 3/2000 | McClure |
| 6,084,804 A | 7/2000 | McPartland |
| 7,298,665 B2 | 11/2007 | So et al. |
| RE40,172 E | 3/2008 | Do |
| 8,120,955 B2 | 2/2012 | Wang et al. |
| 8,509,025 B2 | 8/2013 | Scheuerlein et al. |
| 8,565,003 B2 | 10/2013 | Siau |
| 8,582,338 B1 | 11/2013 | Argyres |
| 8,848,424 B2 | 9/2014 | Ikeda |
| 9,697,880 B2 | 7/2017 | Andre et al. |
| 9,812,499 B1 | 11/2017 | Satoh et al. |
| 10,373,682 B2 | 8/2019 | Parkinson et al. |
| 10,497,438 B2 | 12/2019 | Choi et al. |
| 10,545,692 B2 | 1/2020 | Franklin et al. |
| 10,600,463 B2 | 3/2020 | Matsunami |
| 10,762,973 B1 | 9/2020 | Lu et al. |
| 10,784,313 B1 | 9/2020 | Gong et al. |
| 10,832,778 B1 | 11/2020 | Yang et al. |
| 11,024,358 B1 | 6/2021 | Srivastava |
| 11,049,559 B1 | 6/2021 | Jeon |
| 11,099,784 B2 | 8/2021 | Choi et al. |
| 11,114,166 B2 | 9/2021 | Okuyama et al. |
| 11,328,759 B2 | 5/2022 | Parkinson et al. |
| 11,386,945 B2 * | 7/2022 | Parkinson ............. G11C 11/161 |
| 2006/0050590 A1 | 3/2006 | Nautiyal et al. |
| 2006/0145193 A1 | 7/2006 | So et al. |
| 2012/0099367 A1 | 4/2012 | Azuma et al. |
| 2012/0230090 A1 | 9/2012 | Takahashi et al. |
| 2013/0077384 A1 | 3/2013 | Azuma et al. |
| 2014/0098594 A1 | 4/2014 | Azuma et al. |
| 2014/0112055 A1 | 4/2014 | Kawahara et al. |
| 2017/0004883 A1 * | 1/2017 | Sekar ................ G11C 13/0097 |
| 2018/0130539 A1 | 5/2018 | Ikeda et al. |
| 2019/0027212 A1 | 1/2019 | Sawada et al. |
| 2019/0267082 A1 | 8/2019 | Parkinson et al. |
| 2020/0185596 A1 | 6/2020 | Le et al. |
| 2020/0303007 A1 | 9/2020 | Shirai |

FOREIGN PATENT DOCUMENTS

| | | |
|---|---|---|
| JP | 2013030241 A | 2/2013 |
| JP | 2017501524 A | 1/2017 |
| KR | 20140104880 A | 8/2014 |
| KR | 20200102336 A | 8/2020 |
| WO | 2016143383 A1 | 9/2016 |

OTHER PUBLICATIONS

Notice of Allowance dated Sep. 28, 2021, U.S. Appl. No. 17/061,626, filed Oct. 2, 2020.

Notice of Allowance dated Jan. 11, 2022, U.S. Appl. No. 17/061,626, filed Oct. 2, 2020.

First Action Interview Pilot Program Pre-Interview Communication dated Sep. 30, 2021, U.S. Appl. No. 17/061,636, filed Oct. 2, 2020.

First Action Interview Office Action Summary dated Nov. 2, 2021, U.S. Appl. No. 17/061,636, filed Oct. 2, 2020.

Response to Office Action dated Jan. 31, 2022, U.S. Appl. No. 17/061,636, filed Oct. 2, 2020.

Notice of Allowance dated Feb. 24, 2022, U.S. Appl. No. 17/061,636, filed Oct. 2, 2020.

* cited by examiner

Level 1

Level 2

SIGNAL AMPLIFICATION IN MRAM DURING READING, INCLUDING A PAIR OF COMPLEMENTARY TRANSISTORS CONNECTED TO AN ARRAY LINE

CLAIM OF PRIORITY

This application is a continuation application of U.S. patent application Ser. No. 17/061,636, entitled, "SIGNAL AMPLIFICATION IN MRAM DURING READING," by Parkinson et al., filed Oct. 2, 2020, issued as U.S. Patent No. 11,386,945 on Jul. 12, 2022, incorporated by reference herein in its entirety.

BACKGROUND

Memory is widely used in various electronic devices such as cellular telephones, digital cameras, personal digital assistants, medical electronics, mobile computing devices, non-mobile computing devices, and data servers. Memory may comprise non-volatile memory or volatile memory. A non-volatile memory allows information to be stored and retained even when it is not connected to a source of power.

One example of a non-volatile memory is magnetoresistive random access memory (MRAM), which uses magnetization to represent stored data, in contrast to some other memory technologies that use electronic charges to store data. Generally, MRAM includes a large number of memory cells formed on a semiconductor substrate, where each memory cell represents (at least) one bit of data. A bit of data is written to a memory cell by changing the direction of magnetization of a magnetic element within the memory cell, and a bit is read by measuring the resistance of the memory cell. Low resistance typically represents a "0" bit and high resistance typically represents a "1" bit.

BRIEF DESCRIPTION OF THE DRAWINGS

Like-numbered elements refer to common components in the different figures.

DETAILED DESCRIPTION

Figure 1:
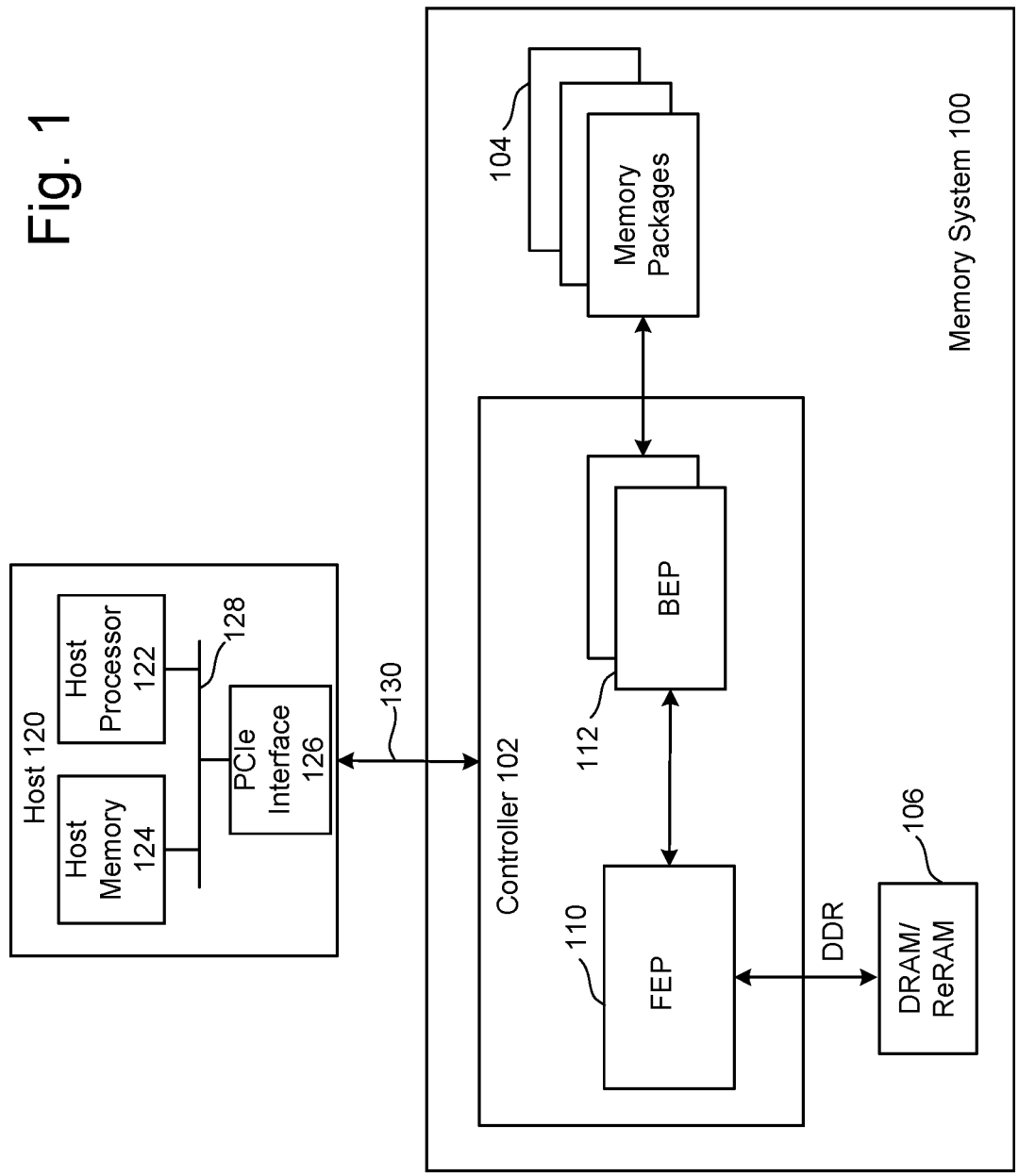
FIG. 1 is a block diagram of an example implementation of a memory system connected to a host.

Apparatuses and techniques are described for reading MRAM memory cells.

An MRAM memory cell comprises a magnetic switching material which can have different data states based on different magnetization states, where each state has a different resistance. An MRAM memory cell can be a two-terminal device which is written to a low resistance state (e.g., 25 kΩ)) by a current in one direction applied for approximately 50 nsec., and to a high resistance state (e.g., 50 kΩ)) by a current in the opposite direction, a current which may exceed that required to write to low resistance for approximately 50 nsec.; such as by 20% if the critical dimension (CD), for example, is 20 nm and the resistance-area (RA) product of the memory cell is 10. The current induces magnetic changes in a free layer of the memory cell.

Moreover, when many memory cells are arranged in a cross-point memory array, each memory cell can include a storage element (e.g., comprising the magnetic switching material) in series with a selector such as an ovonic threshold switch. The selector can be in a conductive or non-conductive state. To write or read a particular memory cell, a voltage and/or current signal is applied via the respective word line and bit line which are in contact with the memory cell to set the selector is in its conductive state. This is referred to as selecting the memory cell. Once the selector is in its conductive state, a voltage and/or current can be applied to the storage element for writing or reading via the respective word line and bit line. For example, a "self-referenced read" (SRR) may be executed in either direction, to AP (high resistance state) or to P (low resistance state) by selecting the bit in that direction, reading it to generate a level and storing the level, writing the bit in that direction, and reading it to compare to the adjusted stored level. Such adjustment may be a positive increase in voltage for later comparison if the SRR is to the AP state, or a negative decrease in voltage for later comparison if the SRR is to the P state.

After writing, a read operation can be performed to determine the data state of the memory cell. The read operation can involve determining a voltage across the memory cell when a current is applied. One approach for reading involves sensing the voltage a first time, then performing a potentially destructive write which ensures the memory cell is in a high resistance state, then sensing the voltage a second time. If the voltage increases by more than a specified amount, it can be concluded that the memory cell was initially in the low resistance state and was programmed to the high resistance state by the write operation. The write operation is destructive in this case. If the voltage does not increase by more than the specified amount, it can be concluded that the memory cell was initially in the high resistance state and remains in the high resistance state after the write operation. The write operation is not destructive in this case.

To provide a bidirectional writing capability, the word lines and bit lines connected to the memory cell can both include transistors such as MOSFETs for passing a voltage and/or current to the memory cell. A MOSFET, or metal—oxide—semiconductor field-effect transistor, is provided in a conductive state when it is biased with an appropriate gate-to-source voltage, referred to as Von. However, Von can change when the memory cell changes its resistance state. This affects the sensing of the voltage generated from reading the memory cell. This reading can occur in a path through the decoding transistors to the global node into the sense amp (sense circuit) that is past the series combination of the decoding transistors and the selected memory bit (cell).

Techniques provided herein address the above and other issues. Each bit line and word line is connected to a transistor pair comprising a pMOSFET (a p-channel MOSFET) in parallel with an nMOSFET (an n-channel MOSFET). The bit lines and word lines are conductive lines. The conductive lines include first conductive lines which connect to a first end (e.g., a bottom) of each memory cell and second conductive lines which connect to a second end (e.g., a top) of each memory cell. When selecting a memory cell to be read, a voltage of a first conductive line may be pulled up (increased) to a positive voltage using a pMOSFET while a voltage of a second conductive line may be pulled down (decreased), e.g., to 0 V using an nMOSFET. This approach minimizes a capacitance while the selector is turned on. Such turn-on of the selector may induce a transient current through the storage element as the voltage across the selector collapses from Vth(selector), for example 2.2 V, to Vhold(selector), for example 1.3 V, resulting in a discharge current through the memory bit as the voltage across it decreases. Such current above the steady state read current may induce a premature state change in the storage element before the level can be stored for comparison to the resulting read level after the bit is written.

In one option, when reading the selected memory cell, the parallel nMOSFET of the first conductive line may also be used by turning it on after the selected memory bit's selector turns on, in addition to the pMOSFET used to select and turn-on the bit selector in series with the storage element. The nMOSFET adds a resistance which offsets a decreased resistance of the pMOSFET to allow more accurate sensing of the voltage across the memory cell at the global node past the decoding transistors that select the bit using the host-provided address when the cycle is activated. The amplitude of the voltage which is sensed by the sense amp circuit is therefore better preserved. In the type of read operation mentioned above in which the voltage is sensed a first time and a second time, the nMOSFET can be turned on (set in a conductive state) along with the pMOSFET each time. The nMOSFET can be left on or turned off (set in a non-conductive state) while the p MOSFET is turned on during the potentially destructive write operation. And then the nMOSFET is turned on, so the read after the potentially destructive write has the same conditions as the read before the write, allowing comparison of the results levels to determine if the bit state of the storage element has changed after the write.

In another option, when reading the selected memory cell, the pMOSFET is turned off while the parallel nMOSFET is turned on. This increases the total resistance of the transistor pair so that the voltage which is sensed by a sense circuit is amplified if the storage element changes from the low resistance state to high resistance state (LRS to HRS) after the destructive write, the second read being done also with only the nMOSFET on. In the type of read operation mentioned above in which the voltage is sensed a first time and a second time, e.g., the SRR, the nMOSFET can be turned on while the pMOSFET is turned off each time. The nMOSFET can be left on or turned off while the pMOSFET is turned on during the potentially destructive write operation.

Using the pMOSFET but not the nMOSFET during the initial selecting of a bit helps reduce capacitance and allow excess voltage across the memory cell to discharge faster, thereby reducing the resulting bit error rate (and disturbs) during the initial read.

Generally, both writing and reading can be optimized by a choice of which one or both transistors of a parallel transistor pair in a conductive state during the selection versus subsequent read and write operations.

These and other benefits are described below.

FIG. 1 is a block diagram of an example implementation of a memory system connected to a host. The memory system 100 can implement the technology proposed herein. Example memory systems include solid state drives ("SSDs"), memory cards and embedded memory devices. Other types of memory systems can also be used.

Memory system 100 of FIG. 1 comprises a controller 102, non-volatile memory arranged in one or more memory packages 104 for storing data, and local memory 106 such as DRAM or ReRAM. The controller 102 comprises a Front End Processor (FEP) circuit 110 and one or more Back End Processor (BEP) circuits 112. In one approach, the FEP circuit 110 is implemented on an ASIC and each BEP circuit 112 is implemented on a separate ASIC. In other approaches, a unified controller ASIC can combine both the front end and back end functions. The ASICs can be implemented on the same semiconductor such that the controller 102 is manufactured as a System on a Chip (SoC). The FEP circuit 110 and BEP circuit 112 can both include their own processors. In one approach, the FEP circuit 110 and BEP circuit 112 work in a master-slave configuration where the FEP circuit 110 is the master and each BEP circuit 112 is a slave. For example, the FEP circuit 110 can implement a Flash Translation Layer (FTL) or Media Management Layer (MML). See also FIG. 2. The BEP circuit 112 manages memory operations in the memory packages/die at the request of the FEP circuit 110. For example, the BEP circuit 112 can carry out the read, erase, and programming processes. Additionally, the BEP circuit 112 can perform buffer management, set specific voltage levels required by the FEP circuit 110, perform error correction (ECC), and control the toggle mode interfaces to the memory packages. Each BEP circuit 112 can be responsible for its own set of memory packages. Alternatively, the interface may be JEDEC industry standard DDR or LPDDR, such as DDR5 or LPDDR5.

The memory packages 104 can include one or more memory die. Therefore, the controller 102 is connected to one or more non-volatile memory die. In one approach, each memory die in the memory packages 104 utilizes storage class memory (SCM) based on resistive random access memory (such as ReRAM, MRAM or FeRAM or a phase change memory (PCM).

The controller 102 communicates with a host 120 via an interface 130. The interface can implement a protocol such as NVM Express (NVMe) over PCI Express (PCIe) or DDR5 or LPDDR5. For working with the memory system 100, the host 120 includes a host processor 122, a host memory 124, and a PCIe interface 126 connected along bus 128. The host memory 124 is a physical memory such as DRAM, SRAM, non-volatile memory, or another type of storage. The host 120 is external to and separate from the memory system 100 in this example. In another approach, the memory system 100 is embedded in host 120.

Figure 2:
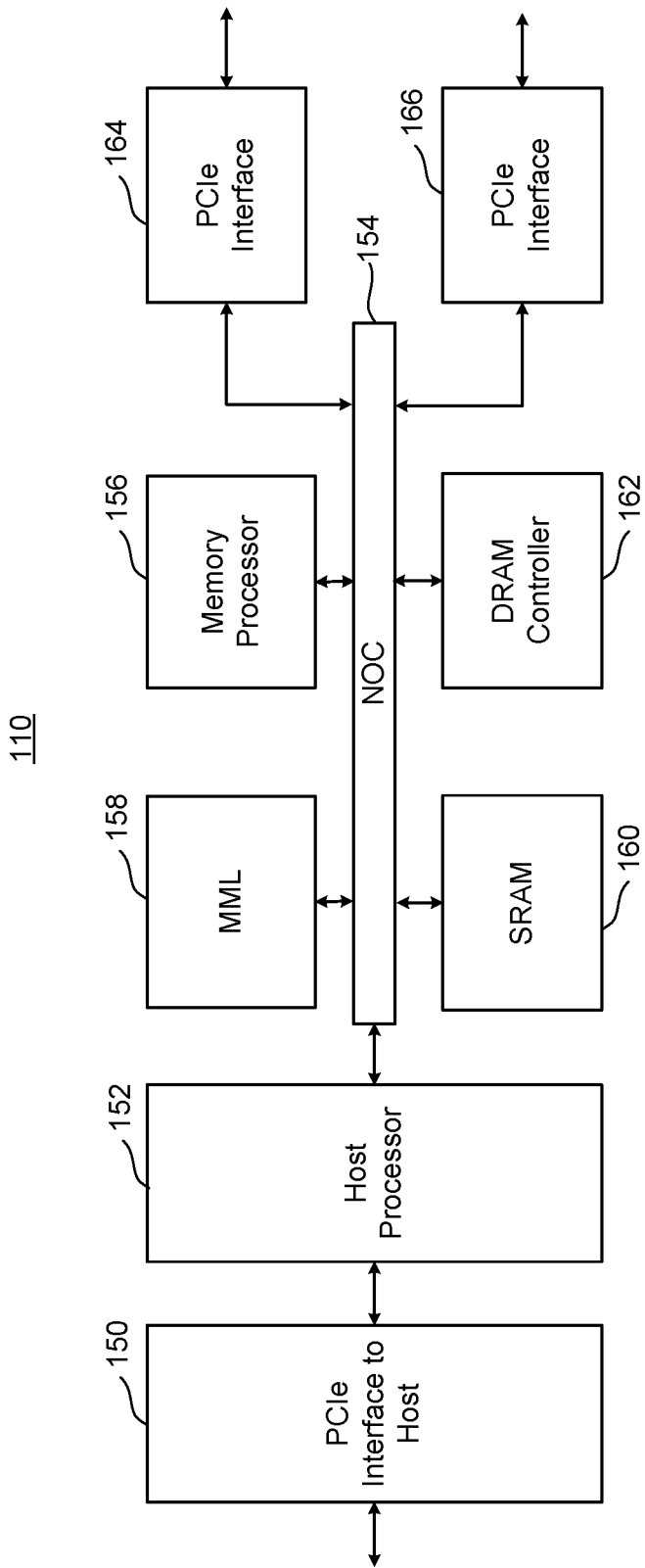
FIG. 2 is a block diagram of an example implementation of the FEP circuit 110 of FIG. 1.

FIG. 2 is a block diagram of an example implementation of the FEP circuit 110 of FIG. 1. A PCIe interface 150 communicates with the host 120 (FIG. 1) and a host processor 152. The host processor 152 is in communication with a network-on-chip (NOC) 154. A NOC is a communication subsystem on an integrated circuit, typically between cores in a SoC. NOCs can span synchronous and asynchronous clock domains or use unclocked asynchronous logic. NOC technology applies networking theory and methods to on-chip communications. The NOC 154 communicates with a memory processor 156, an SRAM 160 and a DRAM controller 162. The DRAM controller 162 is used to operate and communicate with the local memory 106 such as DRAM 106. The SRAM 160 is local RAM memory used by memory processor 156. The memory processor 156 is used to run the FEP circuit and perform various memory operations. The NOC also communicates with two PCIe Interfaces 164 and 166. In FIG. 1, the SSD controller includes two BEP circuits 112; therefore, there are two PCIe Interfaces 164 and 166. Each PCIe Interface communicates with one of the BEP circuits 112. The number of BEP circuits 112 and PCIe Interfaces can vary.

The FEP circuit 110 can include a Flash Translation Layer (FTL) or, more generally, a Media Management Layer (MML) 158 that performs memory management (e.g., garbage collection, wear leveling and load balancing), logical-to-physical address translation, communication with the host, management of DRAM (local volatile memory) and management of the overall operation of the SSD or other non-volatile storage system. The MML 158 may be integrated as part of the memory management that may handle memory errors and interfacing with the host. In particular, the MML may be a module in the FEP circuit 110 and may include an algorithm in the memory device firmware which translates writes from the host into writes to the memory structure of a die (such as the memory array 502 of FIGS. 5 and 6A, respectively. The MML 158 may be needed because: 1) the memory may have limited endurance; 2) the memory structure may only be written in multiples of pages; and/or 3) the memory structure may not be written unless it is erased as a block. The MML 158 understands these potential limitations of the memory structure which may not be visible to the host. Accordingly, the MML 158 attempts to translate the writes from host into writes into the memory structure.

Figure 3:
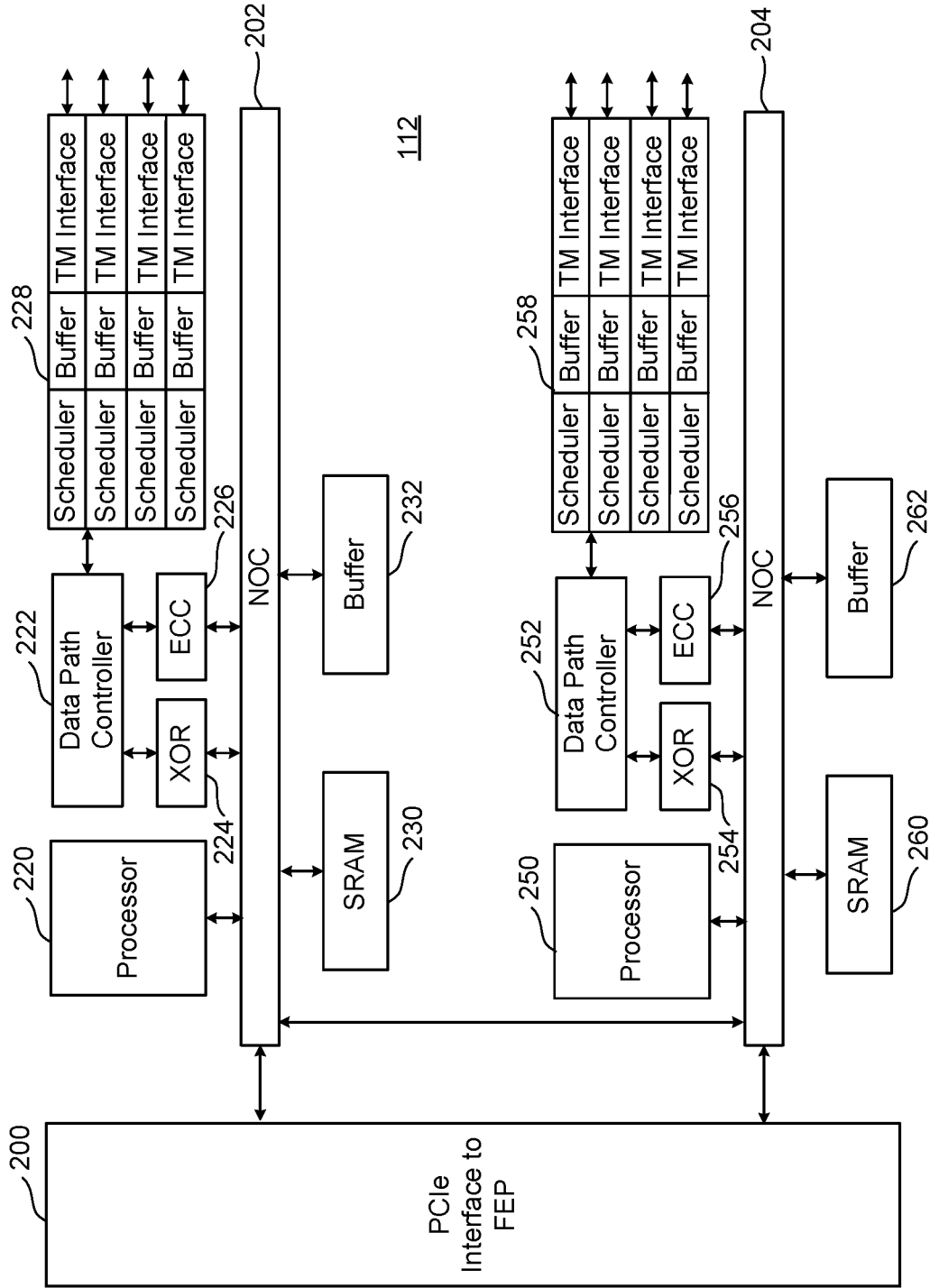
FIG. 3 is a block diagram of an example implementation of the BEP circuit 112 of FIG. 1.

FIG. 3 is a block diagram of an example implementation of the BEP circuit 112 of FIG. 1. In some approaches, the BEP circuit is part of a controller. The BEP circuit includes a PCIe Interface 200 for communicating with the FEP circuit 110 (e.g., communicating with one of PCIe Interfaces 164 and 166 of FIG. 2). The PCIe Interface 200 communicates with two NOCs 202 and 204. In one approach, the two NOCs are combined. The NOCs 202 and 204 are connected to SRAMs 230 and 260, respectively, buffers 232 and 262, respectively, processors 220 and 250, respectively, and data path controllers 222 and 252, respectively, via XOR engines 224 and 254, respectively, and ECC engines 226 and 256 (used to perform error correction), respectively. The XOR engines allow data to be combined and stored in a manner which allows recovery in case there is a programming error.

The data path controllers 222 and 252 are connected to interface modules 228 and 258, respectively, which each communicate via four channels, in this example, with memory packages. Thus, the NOCs 202 and 204 each have four channels for communicating with memory packages. Each interface 228/258 includes four Toggle Mode interfaces (TM Interface), four buffers and four schedulers. There is one scheduler, buffer, and TM Interface for each of the channels. The data path controllers 222 and 252 can comprise a processor, FPGA, microprocessor, or other type of controller. The XOR engines 224 and 254 and ECC engines 226 and 256 can be dedicated hardware circuits such as hardware accelerators. In other approaches, the XOR engines 224 and 254 and ECC engines 226 and 256 can be implemented in software. The scheduler, buffer, and TM Interfaces can be hardware circuits.

Figure 4:
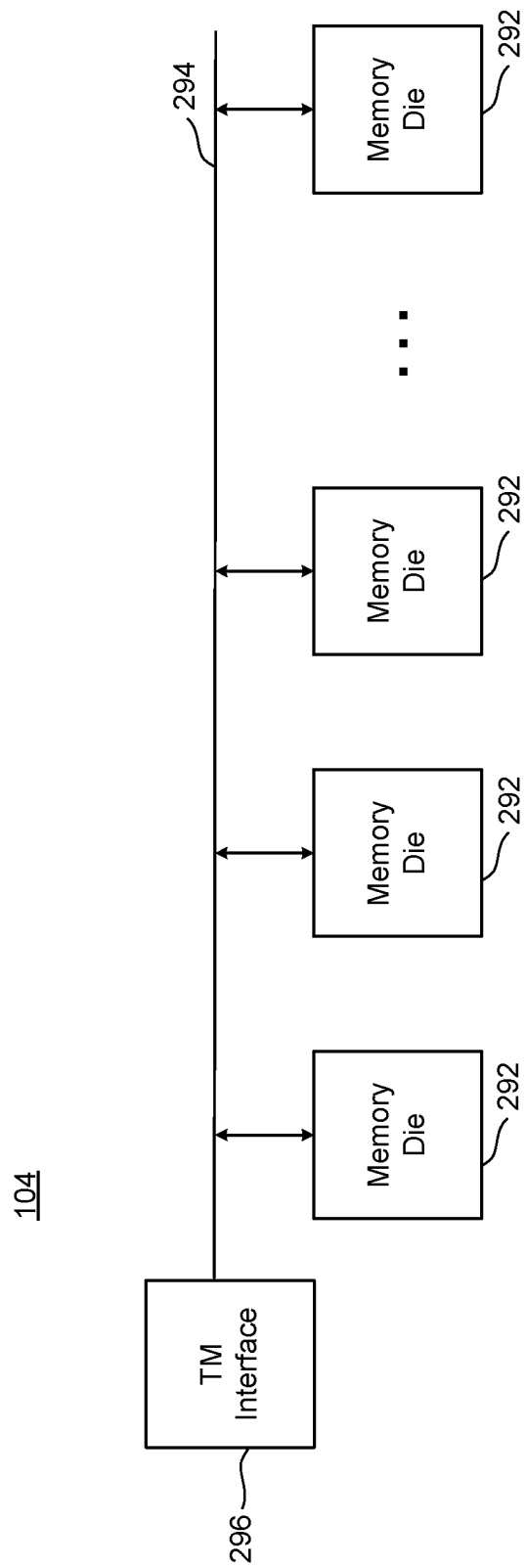
FIG. 4 is a block diagram of an example implementation of the memory package 104 of FIG. 1.

FIG. 4 is a block diagram of an example implementation of the memory package 104 of FIG. 1. The memory package includes a plurality of memory die 292 connected to a memory bus 294, which includes data lines and chip enable lines. The memory bus 294 connects to a Toggle Mode Interface 296 for communicating with the TM Interface of the BEP circuit 112 (see e.g., FIG. 3). The memory package can include a small controller connected to the memory bus and the TM Interface, and can have one or more memory die. In one approach, each memory package includes eight or sixteen memory die; however, the number of die can vary. Alternatively, such controller, ECC, and wear-leveling functions can be implemented within each memory chip as an "on-chip" controller with ECC and wear-leveling.

Figure 5A:
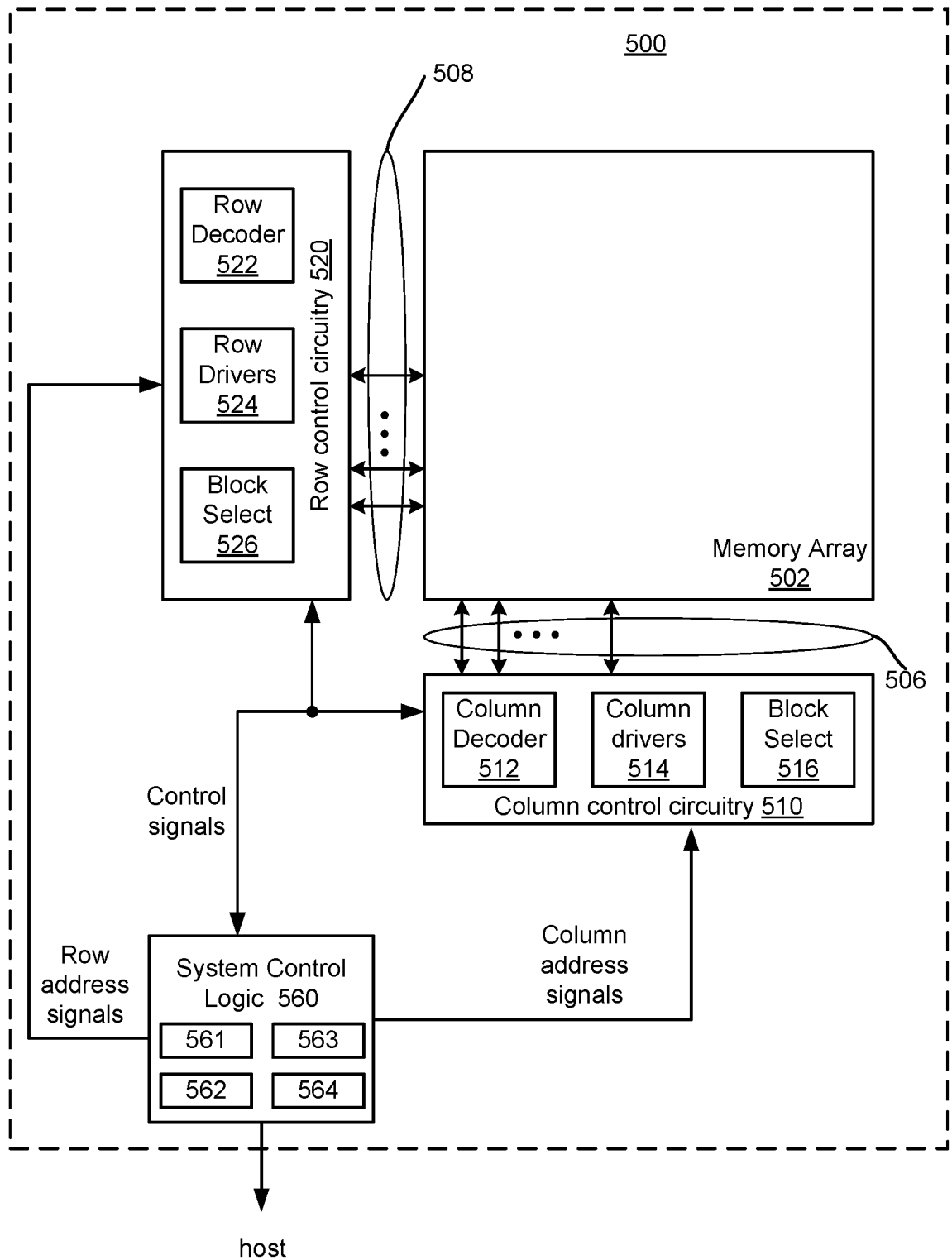
FIG. 5A is a block diagram of one example of a memory system that can implement the technology described herein.

FIG. 5A is a block diagram of one example of a memory system that can implement the technology described herein. The memory system 500 includes a memory array 502 of memory cells. For example, the memory cells can be arranged in rows and columns in a cross-point array, where conductive lines such as word lines extend in the row direction and bit lines extend in the column direction. See FIG. 7B, for example. The memory system 500 includes row control circuitry 520, whose outputs 508 are connected to respective word lines of the memory array 502. The row control circuitry 520 receives a group of M row address signals and various control signals from a System Control Logic circuit 560. The row control circuitry may include such circuits as row decoders 522, row drivers 524, and block select circuitry 526 for both reading and writing operations. The memory system 500 also includes column control circuitry 510 whose input/outputs 506 are connected to respective bit lines of the memory array 502. The column control circuitry 510 receives a group of N column address signals and various control signals from the System control logic circuit 560. The column control circuitry may include such circuits as column decoders 512, column drivers 514, block select circuitry 516, as well as read/write circuitry, and I/O multiplexers. See also FIG. 5B

System control logic circuit 560 receives data and commands from a host and provides output data and status to the host. In other approaches, the system control logic circuit 560 receives data and commands from a separate controller circuit and provides output data to that controller circuit, with the controller circuit communicating with the host. The system control logic circuit 560 can include a state machine 561 that provides die-level control of memory operations. In one approach, the state machine is programmable by software. In other approaches, the state machine does not use software and is completely implemented in hardware (e.g., electrical circuits). In another approach, the state machine is replaced by a micro-controller. The system control logic circuit 560 can also include a power control circuit 562 which controls the power and voltages supplied to the rows and columns of the memory array 502 during memory operations. The system control logic circuit 560 may include one or more state machines, registers 563 and other control logic for controlling the operation of memory system 500. The system control logic circuit 560 can also include a sense circuit 564 such as a sense amplifier. The sense circuit can be used in read operations to determine the data state of a memory cell as described herein. For example, see FIG. 12B.

In some approaches, all of the elements of memory system 500, including the system control logic circuit 560, can be formed as part of a single die. In other approaches, some or all of the system control logic circuit 560 can be formed on a different die.

For purposes of this document, the phrase "a control circuit," "one or more control circuits" or the like can include the row control circuitry 520, column control circuitry 510, a controller, a state machine, a micro-controller and/or other control circuitry as represented by the system control logic circuit 560, or other analogous circuits that are used to control non-volatile memory.

The memory array 502 can comprise a single level cross-point array or a multiple level cross-point array (FIG. 7B), for example. The memory structure can be formed above a single substrate, such as a wafer.

In one approach, memory array 502 comprises a three dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type) substrate. In one example, the non-volatile memory cells comprise vertical NAND strings with charge-trapping layer.

In another approach, memory array 502 comprises a two dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory array 502 is not limited to the examples above. Many different types of memory array architectures or memory technologies can be used to form the memory structure. Other examples of suitable technologies for memory cells of the memory array 502 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory array 502 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines, respectively). In another approach, the memory cells may include conductive bridge memory cells. A conductive bridge memory cell may also be referred to as a programmable metallization cell. A conductive bridge memory cell may be used as a state change element based on the physical relocation of ions within a solid electrolyte. In some cases, a conductive bridge memory cell may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory cell may have a wide range of programming thresholds over temperature.

Magnetoresistive random access memory (MRAM) stores data using magnetic storage elements. The elements are formed from two ferromagnetic plates, each of which can hold a magnetization, separated by a thin insulating layer. See also FIG. 7A. One of the two plates (a reference layer) is a permanent magnet set to a particular polarity and the other plate (a free layer) has a magnetization that can be changed to match that of an external field to store memory. A memory device is built from a grid of such memory cells. In one approach for programming, each memory cell lies between a pair of conductive lines arranged at right angles to each other, parallel to the cell, one above and one below the cell. When current is passed through the conductive lines, an induced magnetic field is created. MRAM based memory approaches will discussed in more detail below.

Phase change memory (PCM) exploits the unique behavior of chalcogenide glass. One approach uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM approaches, the memory cells are programmed by current pulses. Note that the use of "pulse" in this document does not require a square pulse but includes a (continuous or non-continuous) vibration or burst of sound, current, voltage light, or other wave.

The technology described herein is not limited to a single specific memory structure, memory construction or material composition, but covers many relevant memory structures within the spirit and scope of the technology as described herein and as understood by one of ordinary skill in the art.

The elements of FIG. 5A can be grouped into two parts: the memory array 502 and the peripheral circuitry, including all of the other elements. An important characteristic of a memory circuit is its capacity, which can be increased by increasing the area of the memory die of the memory system 500 that is allocated to the memory array 502. However, this reduces the area of the memory die available for the peripheral circuitry. Moreover, the functions of the system control logic circuit 560 which can be provided on-chip are limited. Consequently, a basic trade-off in the design of a memory die for the memory system 500 is the amount of area to devote to the memory array 502 and the amount of area to devote to the peripheral circuitry.

Additionally, the memory array 502 and the peripheral circuitry may use different fabrication techniques such as NMOS, PMOS and CMOS.

To address these concerns, approaches described below can separate the elements of FIG. 5A onto separately formed dies that are then bonded together. Specifically, the memory array 502 can be formed on one die and some or all of the peripheral circuitry elements, including one or more control circuits, can be formed on a separate die. For example, a memory die can be formed of just the memory cells, such as the array of memory cells of flash NAND memory, MRAM memory, PCM memory, ReRAM memory, or other memory type. Some or all of the peripheral circuitry, including elements such as decoders and sense amplifiers, can then be moved on to a separate die. This allows each of the memory die to be optimized individually according to its technology. For example, a NAND memory die can be optimized for an NMOS based memory array structure, without worrying about the CMOS elements that have now been moved onto a separate peripheral circuitry die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the peripheral elements on the other die. See FIG. 6.

Figure 5B:
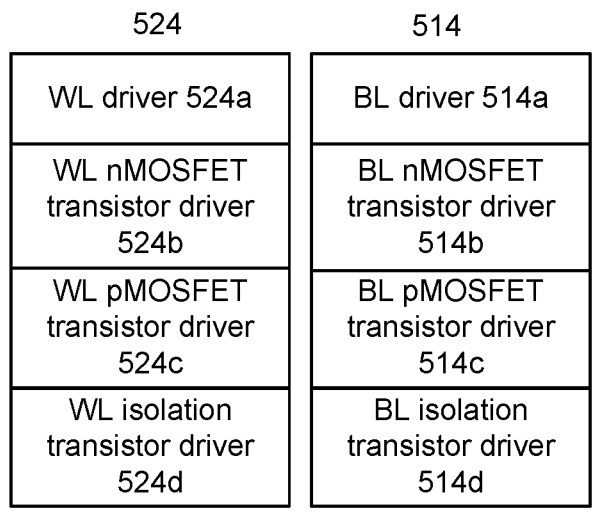
FIG. 5B depicts example drivers among the row drivers 524 and column drivers 514 of FIG. 5A.

FIG. 5B depicts example drivers among the row drivers 524 and column drivers 514 of FIG. 5A. The drivers can comprise charge pumps and regulator circuits for creating and regulating voltages and currents on conductive lines such as word lines and bit lines. The drivers include a word line (WL) driver 524a, a WL nMOSFET transistor driver 524b, a WL pMOSFET transistor driver 524c, and a WL isolation transistor driver 524d. The voltage drivers further include a bit line (BL) driver 513G, a BL nMOSFET transistor driver 513H, a BL pMOSFET transistor driver 514c, and a BL isolation transistor driver 514d. The WL driver and BL drivers can be voltage and/or current drivers. For example, see the driver 575 of FIG. 5C.

Figure 5C:
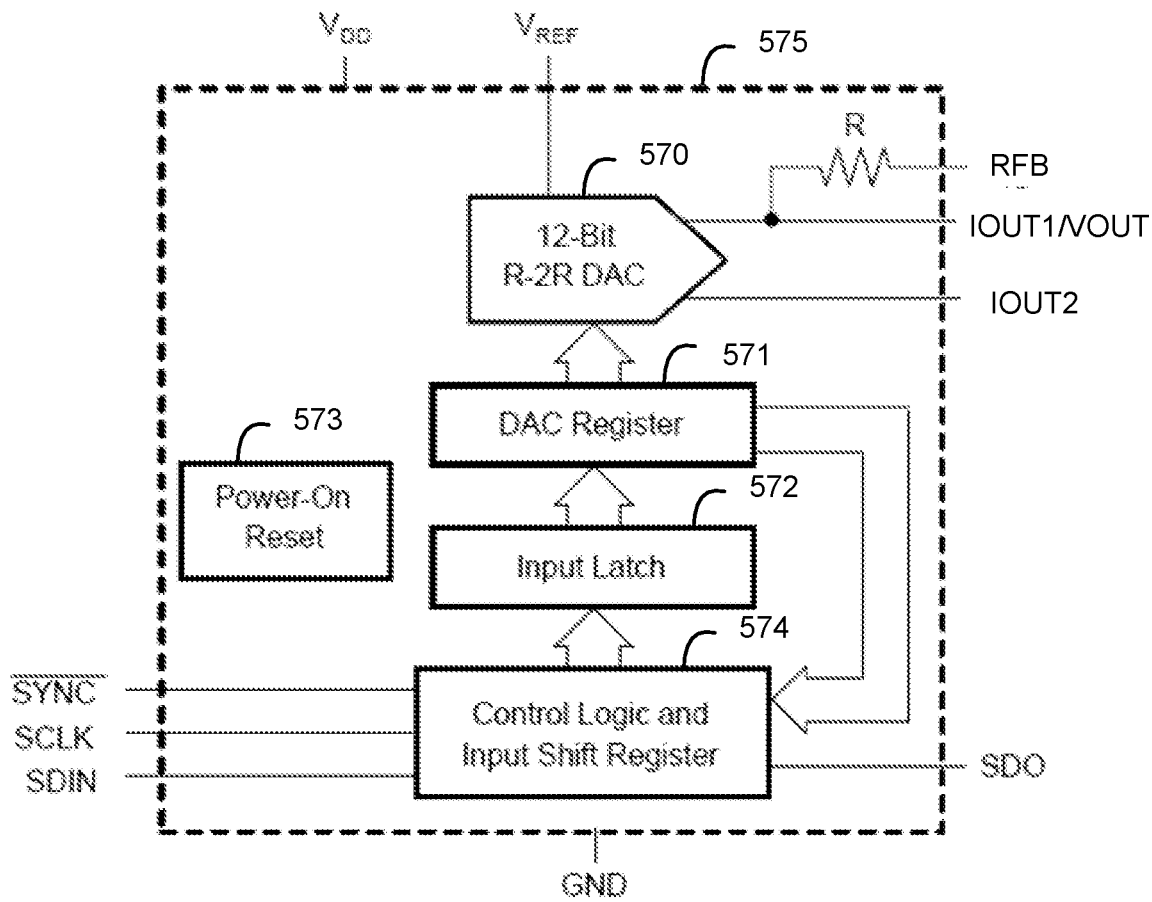
FIG. 5C depicts an example block diagram of a current driver 575.

FIG. 5C depicts an example block diagram of a current driver 575. A current driver can be provided as part of the row control circuitry 520 and/or column control circuitry 510 of FIG. 5A, for example, and can be implemented in different ways. The current driver can be a write current source which is used to set a desired current and/or voltage to perform tasks including writing data to a memory cell, selecting a memory cell and performing a potentially destructive write of a memory cell.

The example current driver is based on the model DAC7811 from Texas Instruments, Inc. and comprises 12-Bit, Serial Input, Multiplying Digital-to-Analog Converter. The current driver outputs a fixed or varying current based on a digital input. The current driver includes a 12-bit R-2R DAC 570, a DAC register 571, an input latch 572, a control logic and input shift register 574 and a power on reset circuit 573.

Inputs to the control logic and input shift register include NOT(SYNC), SCLK and SDIN. NOT(SYNC) is an Active Low Control Input. This is a frame synchronization signal for the input data. When SYNC goes low, it powers on buffers for SCLK and SDIN, and the input shift register is enabled. Data is loaded to the shift register on the active edge of the following clocks. The serial interface counts the clocks and data is latched to the shift register on the 16th active clock edge. SCLK is a Serial Clock Input. By default, data is clocked into the input shift register on the falling edge of the serial clock input. SDIN is a Serial Data Input. Data is clocked into the 16-bit input register on the active edge of the serial clock input. On power-up at the power-on reset, data is clocked into the shift register on the falling edge of SCLK. SDO is a serial data output of the control logic and input shift register, such as for chaining multiple devices.

Outputs of the DAC 570 include RFB, IOUT1 and IOUT2. RFB is feedback resistor for the DAC. IOUT1 is the current output of the DAC. VOUT is an output voltage of the current source. IOUT2 is an analog ground of the DAC. Example current and voltage outputs are provided in FIG. 13E-13H.

Figure 5D:
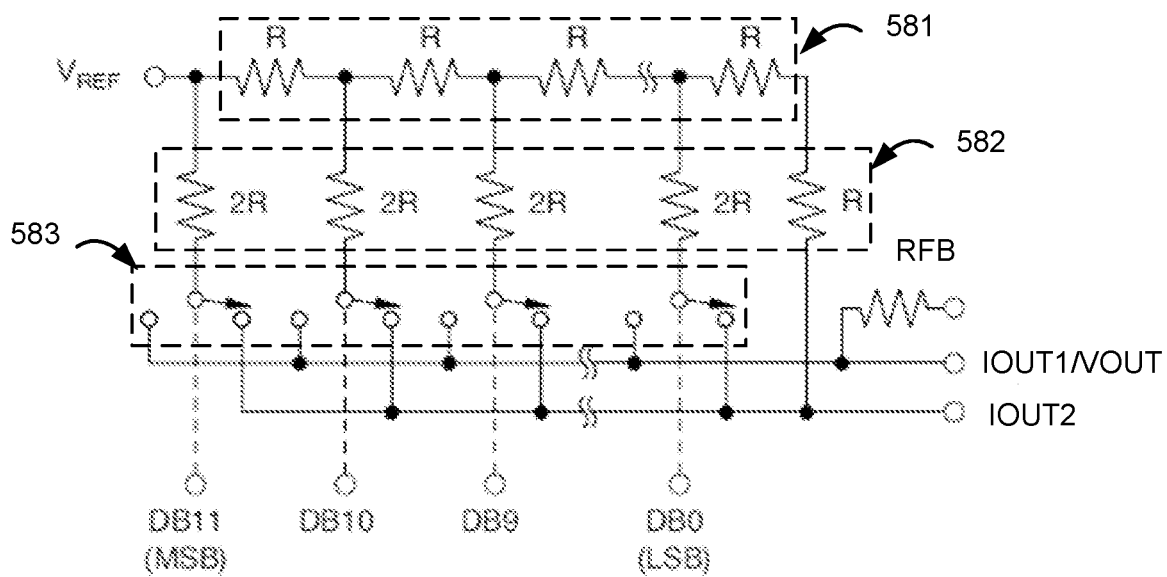
FIG. 5D depicts an example of the DAC circuit 570 of FIG. 5C.

FIG. 5D depicts an example of the DAC circuit 570 of FIG. 5C. The circuit is digitally controlled based on twelve data bits, DB0-DB11, where DB0 is the least significant bit (LSB) and DB11 is the most significant it (MSB). The circuit includes a set of resistors 581 of resistance R arranged serially, and a set of resistors 582 of resistance 2R arranged in parallel in different legs of the ladder. Additionally, each 2R resistor is connected to a switch in a set of switches 583 which can connect the resistor to an output path IOUT1 or IOUT2 based on a value of a respective data bit. The circuit receives a reference voltage Vref which is used to generate currents in the different legs and which determines the DAC full-scale current. Based on the data bits, a corresponding current is provided as an output.

Figure 6:
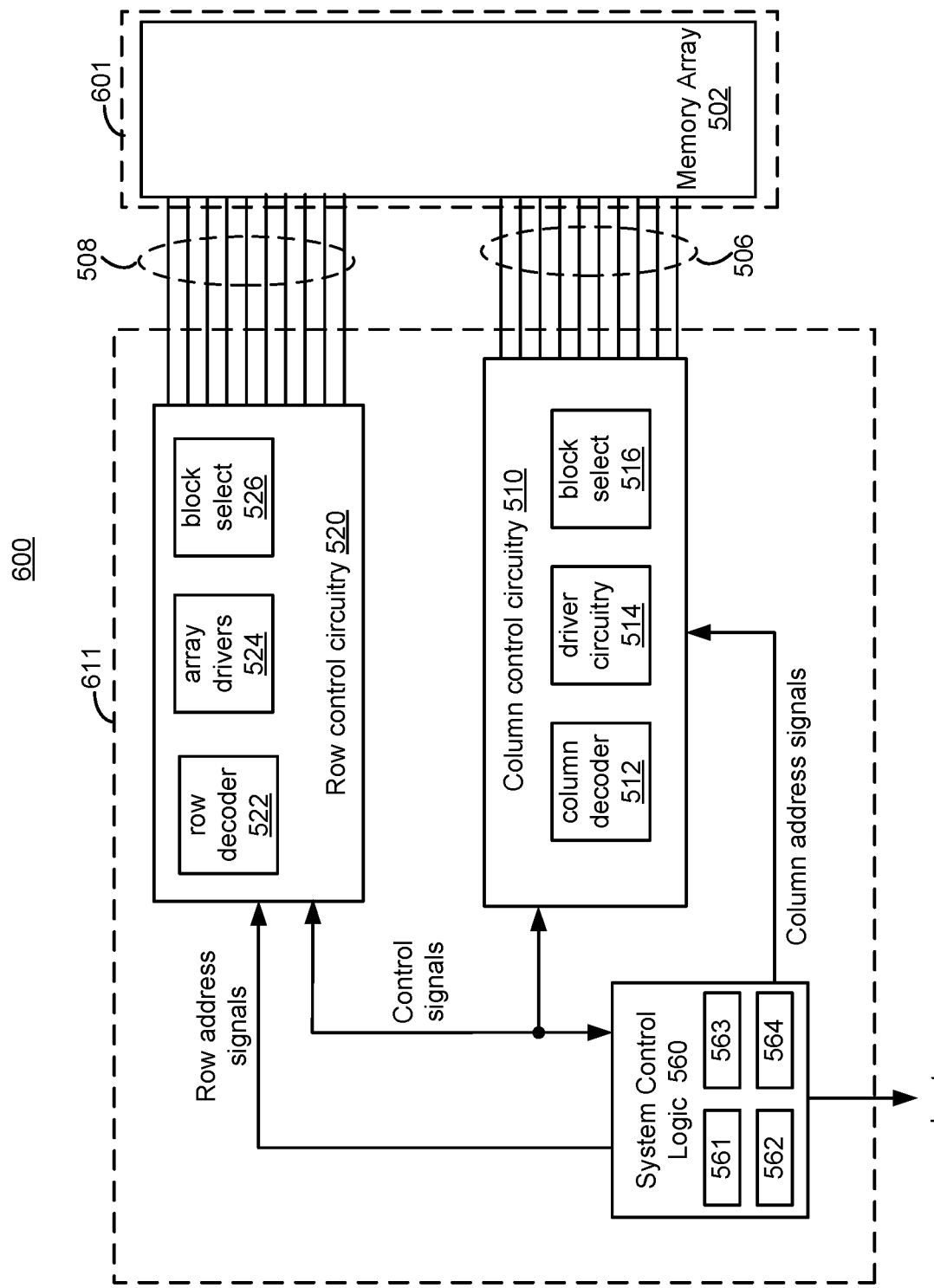
FIG. 6 is a block diagram of another example of a memory system that can implement the technology described herein.

FIG. 6 is a block diagram of another example of a memory system that can implement the technology described herein. This is an alternative to the arrangement of FIG. 5A, and may be implemented using wafer-to-wafer bonding to provide a bonded die pair in a memory system 600, for instance. A control die 611 and a separate memory die 601 are coupled. The control die includes peripheral circuitry, including the System control logic circuit 560, row control circuitry 520, and column control circuitry 510. Additional elements, such as functionalities from controller 102 can also be moved into the control die 611.

The column control circuitry 510 is coupled to the memory array 502 on the through conductive paths. The conductive paths may provide an electrical connection between the column decoder 512, column drivers 514, and block select circuitry 516 and bit lines of memory array 502. Conductive paths may extend from the column control circuitry 510 in the control die 611 through pads on the control die 611. These pads bonded to corresponding pads of the memory die 601, which in turn are connected to bit lines of the memory array 502. Each bit line of the memory array 502 may have a corresponding conductive path that connects to column control circuitry 510. Similarly, the row control circuitry 520 can be coupled to the memory array 502 through conductive paths. Each of conductive path may correspond to a word line, dummy word line, or select gate line. Additional electrical paths may also be provided between the control die 611 and memory die 601.

The system control logic circuit 560, column control circuitry 510, row control circuitry 520 and/or controller 102 (or equivalently functioned circuits), in combination with all or a subset of the other circuits depicted in FIG. 5 or on the control die 611 in FIG. 6 and similar elements in FIG. 5, can be considered to be part of one or more control circuits that perform the functions described herein. The control circuits can include hardware only or a combination of hardware and software (including firmware). For example, a controller programmed by firmware to perform the functions described herein is one example of a control circuit. A control circuit can include a processor, FGA, ASIC, integrated circuit, or other type of circuit.

In the following discussion, the memory array 502 is mainly discussed in the context of a cross-point architecture, although much of the discussion can be applied more generally. In a cross-point architecture, a first set of conductive lines or wires, such as word lines, run in a first direction relative to the underlying substrate and a second set of conductive lines or wires, such a bit lines, run in a second direction relative to the underlying substrate. The memory cells are located at the intersection of the word lines and bit lines. The memory cells at these cross-points can be formed according to any of a number of technologies, including those described above. The following discussion will mainly focus on approaches based on a cross-point architecture using MRAM memory cells.

Figure 7A:
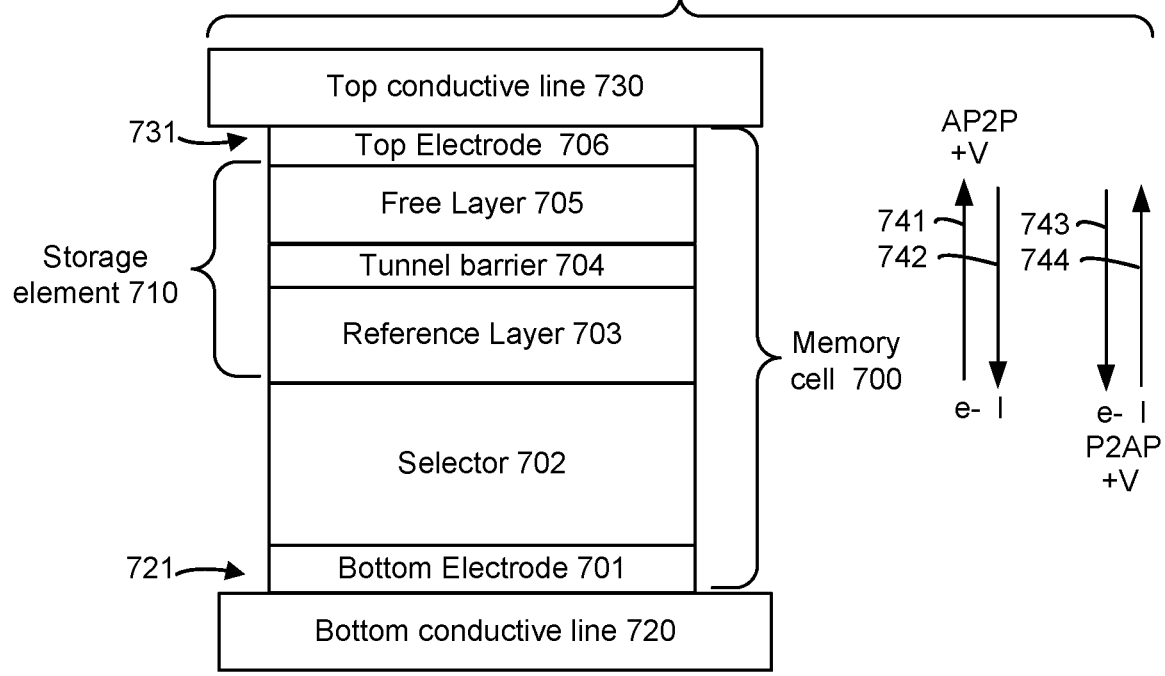
FIG. 7A depicts a cross-sectional view of an example memory cell in the memory array 502 of FIG. 5A or 6.

FIG. 7A depicts a cross-sectional view of an example memory cell in the memory array 502 of FIG. 5A or 6. The memory cell 700 comprises a storage element 710 in series with a selector 702. A memory array can be made up of a large number of such memory cells. The example memory cell 700 comprises a bottom electrode 701 and a top electrode 706 formed of a metal such as titanium (Ti) or titanium nitride (TiN). The storage element is an MRAM in this example and includes a reference layer 703, a tunnel barrier 704 and a free layer 705. The reference layer may comprise a ferromagnetic metal such as a bilayer of CoFeB and CoPt coupled with a conductive spacer comprising, e.g., conductive metals such as Ta, W, Ru, CN, TiN, and TaN. The free layer may comprise a ferromagnetic metal such as CoFe or CoFeB alloy with a thickness on the order of 1-2 nm. An Ir layer can be provided between the free layer and the tunnel barrier and can be doped with Ta, W, or Mo. The tunnel barrier can comprise, e.g., MgO or other insulating material. A cap layer such as MgO can be provided above the free layer to increase the anisotropy of the free layer. The resistance of the storage element changes based on its magnetization.

A top conductive line is connected to the top end 731 of the memory cell, while a bottom conductive line is connected to a bottom end 721 of the memory cell. One end is a first end and the other end is a second end. One of the conductive lines is a word line and the other is a bit line.

The selector can be in any position relative to the storage element, such as above, below or to the side. The selector is below the storage element in this example.

The memory cell can be bipolar (bidirectional), which means a voltage of one polarity is applied across its terminals to write (program) it to a high resistance state (HRS) and a voltage of opposite polarity is applied across its terminals to write it to a low resistance state (LRS). For example, see FIG. 8C. The storage element may thus be reversibly switched between two or more states. One resistance state may represent a binary "0" while another resistance state may represent a binary "1." However, more than two data/resistance states may be used for some types of storage element technologies such as phase change memory, all of which may be beneficially selected and sensed by the means described.

The selector can comprise, e.g., an ovonic threshold switching material. Examples include Ge—Se, Ge—Se—N, Ge—Se—As, Ge—Se—Sb—N, Ge58Se42, GeTe6, Si—Te, Zn—Te, C—Te, B—Te, Ge—As—Te—Si—N, Ge—As—Se—Te—Si and Ge—Se—As—Te.

The selector controls access to the storage element. In particular, to apply a voltage or current to a storage element to change its resistance state, the corresponding selector must first be switched from a non-conductive state to a conductive state by applying a sufficiently high voltage, e.g., a voltage which is higher in magnitude than the threshold voltage. See also FIG. 8B.

The state of the memory cell is based on the relative orientation of the magnetizations of the reference layer and the free layer. If the two layers are magnetized in opposite directions, the memory cell will be in an anti-parallel (AP), high resistance state (HRS). If the two layers are magnetized in the same direction, the memory cell will be in a parallel (P), low resistance state (LRS).

Figure 7B:
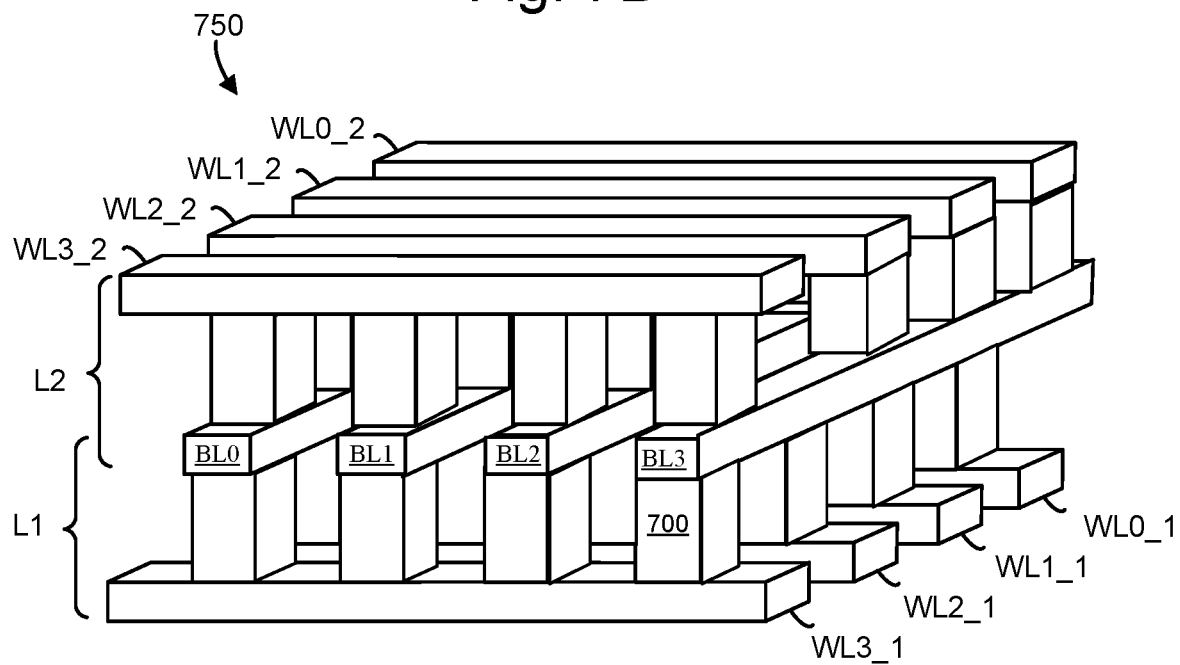
FIG. 7B depicts a perspective view of an example cross-point memory array 750 of memory cells, consistent with the memory cell of FIG. 7A.

The magnetization direction is fixed for the reference layer and can change for the free layer. Data is written to an MRAM memory cell by programming the free layer to either have the same orientation or an opposite orientation as the reference layer. In one approach, an array of MRAM memory cells such as in FIG. 7B is placed in an initial state by setting all of the memory cells to the LRS. A selected memory cell can then be programmed by placing its free layer in the HRS by reversing the magnetic field to be opposite that of the reference layer. The reference layer maintains its orientation when programming the free layer.

To sense (read) a data state stored in an MRAM, a voltage is applied across the memory cell to determine its resistance state. The voltage or current can be applied in either direction across the memory cell. In one approach, the voltage is applied by driving a current. See, e.g., FIGS. 13E and 13F.

One type of MRAM is a perpendicular spin transfer torque (STT) MRAM, where the free layer comprises a switchable direction of magnetization that is perpendicular to the plane of the free layer. STT is an effect in which the orientation of a magnetic layer in a magnetic tunnel junction can be modified using a spin-polarized current. Charge carriers (such as electrons) have a property known as spin which is a small quantity of angular momentum intrinsic to the carrier. An electric current is generally unpolarized (e.g., consisting of 50% spin-up and 50% spin-down electrons). A spin polarized current is one with more electrons of either spin (e.g., a majority of spin-up electrons or a majority of spin-down electrons). In a write operation, by passing a current through the reference layer, a spin-polarized current can be produced. If this spin-polarized current is directed into the free layer, an angular momentum can be transferred to the free layer, changing its direction of magnetization.

For an anti-parallel-to-parallel (AP2P) write, an arrow 741 represents an electron write current, e.g., a direction of electron (e−) movement, and an arrow 742 represents a direction of current flow (I). For example, to generate an electron write current in the direction of the upward arrow 741 in FIG. 7A, the voltage of the top conductive line 730 is set higher (+V) than the voltage of the bottom conductive line 730, due to the negative charge of the electron. The electrons in an electron write current become spin-polarized as they pass through reference layer 703. When the spin-polarized electrons tunnel across the tunnel barrier 704, conservation of angular momentum can result in the imparting of a spin transfer torque on both the free layer 705 and the reference layer 703. This torque is inadequate to affect the magnetization direction of the reference layer, but is sufficient to switch the magnetization orientation in the free layer to become parallel (P) to that of the reference layer, if the initial magnetization orientation of the free layer was anti-parallel (AP) to the reference layer. The parallel magnetizations will then remain stable before and after the electron write current is turned off.

For a parallel-to-anti-parallel (P2AP) write, an arrow 743 represents an electron write current, e.g., a direction of electron (e−) movement, and an arrow 744 represents a direction of current flow (I). If the free layer and reference layer magnetizations are initially parallel, the direction of magnetization of the free layer can be switched to become antiparallel to that of the reference layer by applying an electron write current of opposite direction to the aforementioned case, e.g., in the direction of the downward arrow 743 in FIG. 7A. In this case, the electron write current is applied from the top conductive line 730 to the bottom conductive line 720 by placing the higher voltage (+V) on the bottom conductive line. This will write a free layer in a P state to an AP state. Thus, the magnetization of the free layer can be set into either of two stable orientations based on the direction of the electron write current.

The data ("0" or "1") in the memory cell can read by measuring its resistance. The LRS can represent a "0" bit while the FIRS represents a "1" bit. In a read operation, a read current can be applied across the memory cell by applying an electron read current from the bottom conductive line to the top conductive line, for example, in the AP2P direction, or by from the top conductive line to the bottom conductive line, for example, in the P2AP direction. In a read operation, if the electron write current is too high, this can disturb data stored in a memory cell and change its state. For example, if the electron read current uses the P2AP direction, an excessively high current or voltage in the P2AP direction can switch a memory cell in the low resistance P state to the high resistance AP state during the initial read intended to store a level representing the initial bit state at the start of READ. Since it takes more current to write P2AP, although the MRAM memory cell can be read in either direction, the directional nature of the write operation may make one read direction preferable over the other to reduce bit error rate (disturbs); i.e., the P2AP direction.

To read or write a selected memory cell in a memory array, the bit line and word line corresponding the selected memory cell are biased to place a voltage across the selected memory cell and induce the flow of electrons. This will also apply a voltage across unselected memory cells of the array which are connected to the bit line and word line, resulting in current leakage and wasted power consumption. One approach to reducing current leakage is to place a selector element in series with each MRAM. For example, a threshold switching selector has a high resistance (in an off or non-conductive state) when a bias is kept to a voltage lower than its threshold voltage, and a low resistance (in an on or conductive state) after it is biased to a voltage higher than its threshold voltage. The threshold switching selector remains on until its current is lowered below a holding current, or the voltage is lowered below a holding voltage. See FIG. 8B. When this occurs, the threshold switching selector returns to the off state until after a voltage is again applied which is greater than the threshold voltage (or a current is applied which is greater than the threshold current). Accordingly, to program a memory cell at a cross-point, a voltage and/or current are applied which are sufficient to turn on the associated threshold switching selector and to write the memory cell. To read a memory cell, the threshold switching selector similarly must be turned on before the resistance state of the memory cell can be determined. In one approach, the resistance state is determined by applying a read current, Iread, and detecting the resulting voltage across the memory cell (comprising the storage element and the series-connected selector) and series select transistors on the bit line and word line (global select node into the sense amp). For instance, the voltage can be detected before and after a potentially destructive write operation as described herein.

The MRAM storage element 710 operates as described when the threshold switching selector is turned on, although there is a voltage drop across the threshold switching selector. After the threshold switching selector is turned on by applying a voltage above its threshold voltage, the biasing current or voltage should be high enough above the holding current or holding voltage of the threshold switching selector so that the selector remains on during the subsequent read or write operation. See also FIG. 8A to 8C.

FIG. 7B depicts a perspective view of an example cross-point memory array 750 of memory cells, consistent with the memory cell of FIG. 7A. A memory array can include one or more levels of memory cells. This example includes two levels, namely a first level L1 and a second level L2. More than two levels could be used as well. In this simplified example, there are four word lines WL0_1-WL3_1 on L1, four bit lines BL0-BL3 for L1 and L2, and four word lines WL0_2-WL3_2 on L2. The bit lines are thus shared by the two adjacent levels. A row of memory cells is associated with each word line, and two columns of memory cells (one column for each of the two levels) are associated with each bit line. See also FIGS. 9A and 9B. The orientation of the memory cells, in terms of the position of the storage element relative to the selector, can be the same or different in each layer. That is, the memory cell may be inverted on L2 relative to L1 so that the polarity of voltage and/or current operations of the bit line is the same for each layer. Or, the memory cell may be oriented the same on L1 and L2, so the bit line is selected by taking it negative when selecting L1 for reading and writing P2AP, or positive when selecting L2 for reading and write P2AP; or the voltages are reversed for writing AP2P.

The word lines and bit lines comprise a conductive material such as tungsten or copper, any appropriate metal, heavily doped semiconductor material, a conductive silicide, a conductive silicide-germanide, or a conductive germanide. In this example, the conductors are rail-shaped, the word lines extend parallel to one another and the bit lines extend parallel to one another and perpendicular to the word lines.

Each memory cell is located the intersection of a respective word line and bit line. For example, the memory cell 700 is located the intersection of WL3_1 and BL3. To apply a voltage across memory cell, the control circuitry applies the voltage across WL3_1 and BL3.

The above examples show memory cells in a cylindrical or pillar shape and conductors in the shapes of rails. However, other options are possible.

Figure 8A:
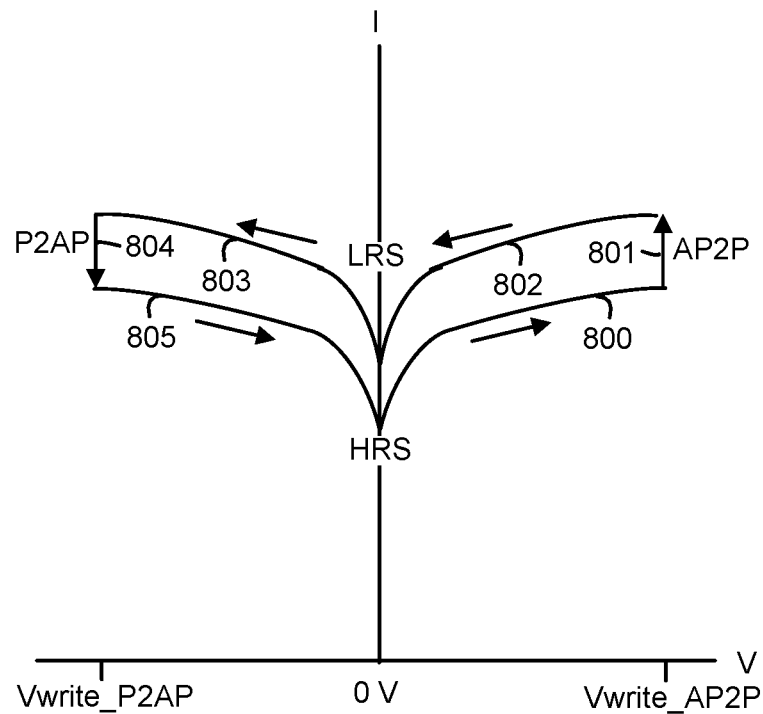
FIG. 8A depicts an example I-V plot for the storage element 710 of FIG. 7A.
Figure 8B:
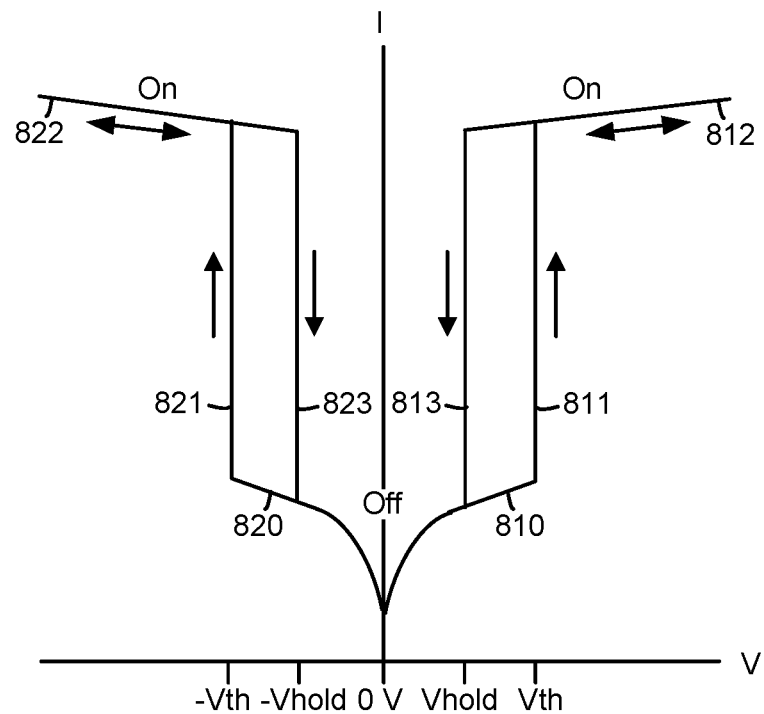
FIG. 8B depicts an example I-V plot for the selector 702 of FIG. 7A.
Figure 8C:
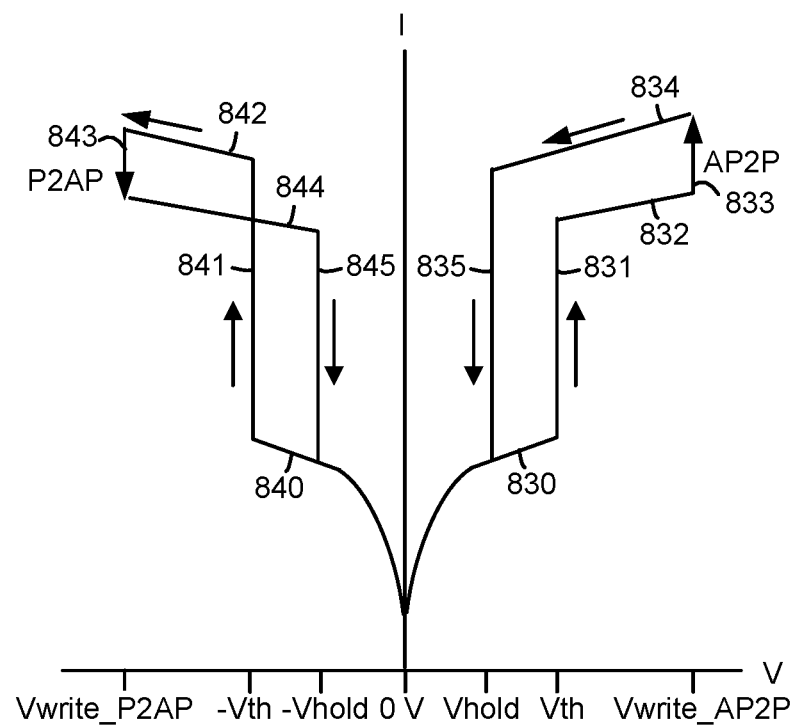
FIG. 8C depicts an example I-V plot for the memory cell 700 of FIG. 7A.

FIG. 8A-8C depict a current on a logarithmic scale and a voltage on a linear scale.

FIG. 8A depicts an example I-V plot for the storage element 710 of FIG. 7A. As discussed in connection with FIG. 7A, a bipolar switching storage element is switched from a HRS to a LRS in an AP2P write process by applying a positive voltage, for instance, across the storage element, and from a LRS to a HRS in a P2AP write process by applying a negative voltage, for instance, across the storage element.

The I-V plot is for the storage element, separate from the selector. The horizontal axis depicts Vwrite_AP2P, a voltage at which the AP2P write operation occurs and Vwrite_P2AP, a voltage at which the P2AP write operation occurs. Vwrite_AP2P is greater than Vwrite_P2AP in this example.

In the AP2P write operation, the storage element is initially in the HRS. When the voltage increases from 0 V to Vwrite_AP2P, the current increases as depicted by the plot 800 (FIG. 8A). An increase in current during the write operation is depicted by the plot 801, when the memory cell is switched to the low resistance state (LRS). Subsequently, as the voltage decreases toward 0 V, the current also decreases, as depicted by the plot 802 (FIG. 8A).

In a P2AP write operation, the storage element is initially in the LRS. When the voltage increases in magnitude from 0 V to Vwrite_P2AP, the current increases as depicted by the plot 803 (FIG. 8A). A decrease in current during the write operation is depicted by the plot 804, when the storage element is switched to the high resistance state (HRS). Subsequently, as the voltage decreases in magnitude toward 0 V, the current also decreases, as depicted by the plot 805.

FIG. 8B depicts an example I-V plot for the selector 702 of FIG. 7A. The I-V plot is for the selector, separate from the memory cell. The horizontal axis depicts the hold threshold voltage, Vhold and the operating threshold voltage, Vth. The positive and negative polarities of these voltages are depicted for use in write operations, consistent with FIG. 8A.

In an AP2P write operation, when the voltage increases from 0 V to Vth, the current increases as depicted by the plot 810. When the voltage increases above Vth, the selector turns on and there is sudden increase in current as depicted by the plot 811. Subsequently, plot 812 shows that the voltage can increase or decrease with only a small change in current. This depends on the resistance. In most cases, the current linearly increases with the voltage for the P state but the AP resistance may decrease with increasing voltage. The current may stop changing when the voltage increases above a certain level because of voltage compliance. When the AP2P write operation is completed, the voltage can decrease to Vhold, at which point the selector turns off, resulting in a sudden decrease in current (plot 813).

In a P2AP write operation, when the voltage increases in magnitude from 0 V to −Vth, the current increases as depicted by the plot 820. When the voltage increases in magnitude above −Vth, the selector turns on and there is sudden increase in current as depicted by the plot 821. Subsequently, plot 822 shows that the voltage can increase or decrease with only a small change in current. When the write operation is completed, the voltage can decrease in magnitude to Vhold, at which point the selector turns off, resulting in a sudden decrease in current (plot 823).

FIG. 8C depicts an example I-V plot for the memory cell 700 of FIG. 7A. The memory cell comprises the storage element in series with the selector. The state of the memory cell can be changed by turning on the selector, then applying a voltage and/or current designed to change the state of the selector.

A signal comprising a voltage and current cannot be applied to a storage element until the selector turns on. The voltage can be increased after the selector turns on to provide an appropriate write or read voltage across the memory cell.

In an AP2P operation, when the voltage increases from 0 V to Vth, the current increases as depicted by the plot 830. When the voltage increases above Vth, the selector turns on and there is sudden increase in current as depicted by the plot 831. The voltage can be increased further to Vwrite_AP2P, as shown by the plot 832, at which point the set operation occurs, resulting in a sudden increase in current (plot 833). Subsequently, when the write operation is completed, plot 834 shows that the voltage decreases to Vhold, at which point the selector turns off, resulting in a sudden decrease in current (plot 835).

In a P2AP write operation, when the voltage increases in magnitude from 0 V to −Vth, the current increases as depicted by the plot 840. When the voltage increases in magnitude above −Vth, the selector turns on and there is sudden increase in current as depicted by the plot 841. The voltage can be increased further to Vwrite_P2AP, as shown by the plot 842, at which point the write operation occurs, resulting in a sudden decrease in current (plot 843). Subsequently, when the write operation is completed, plot 844 shows that the voltage decreases in magnitude to Vhold, at which point the selector turns off, resulting in a sudden decrease in current (plot 845).

Figure 9A:
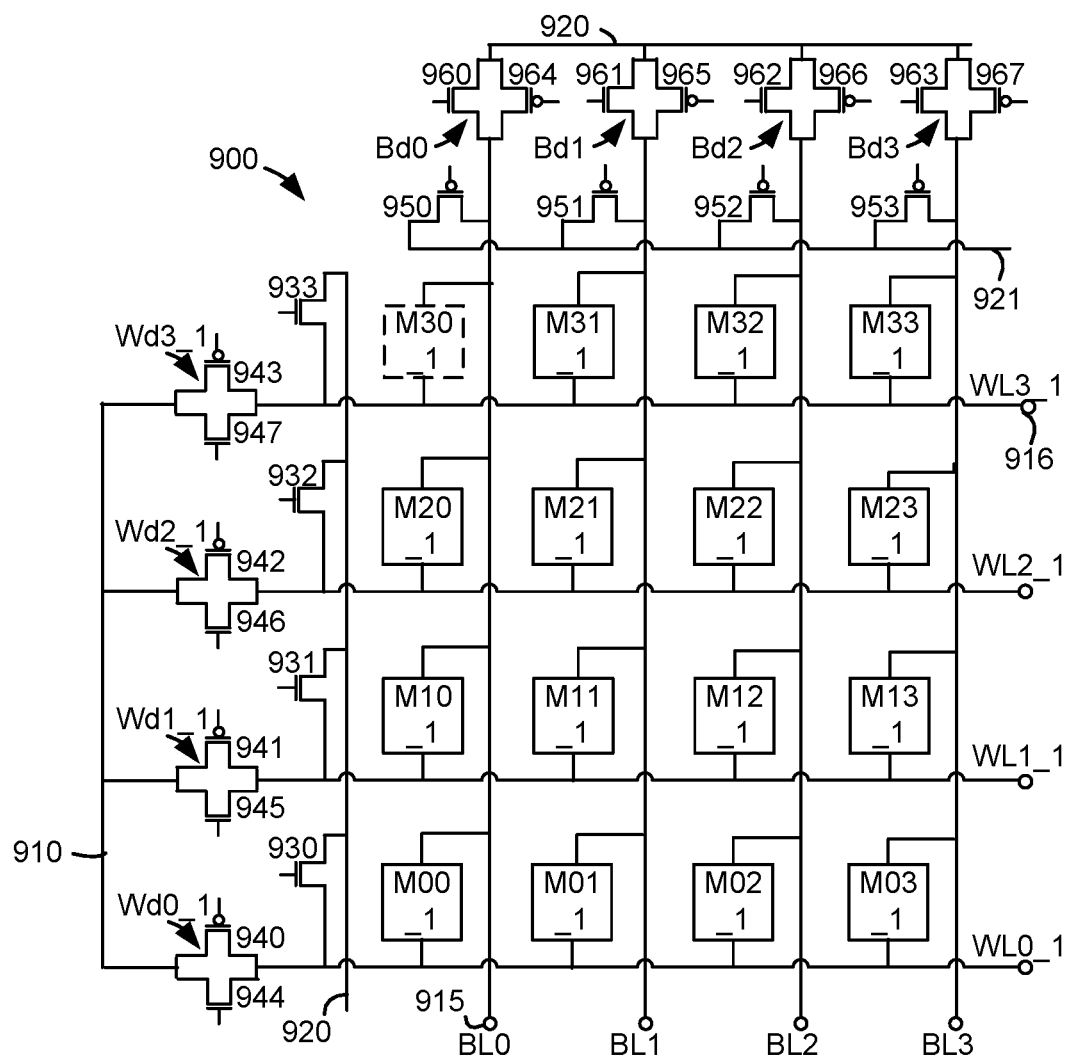
FIG. 9A depicts an example circuit consistent with the first level of the cross-point memory array 750.

FIG. 9A depicts an example circuit 900 consistent with the first level of the cross-point memory array 750. The word lines WL0_1 to WL3_1 are depicted along with the bit lines BL0-BL3. There are sixteen example memory cells arranged in four rows and four columns, where each row is connected to a respective word line and each column is connected to a respective bit line. Each memory cell may be a two-terminal device in which one terminal is connected to a first conductive line and another terminal is connected to a second conductive line. The conductive lines may be metal or doped silicon, for instance.

For example, memory cells M00_1, M01_1, M02_1 and M03_1 are connected to WL0_1 and to BL0-BL3, respectively, memory cells M10_1, M11_1, M12_1 and M13_1 are connected to WL1_1 and to BL0-BL3, respectively, memory cells M20_1, M21_1, M22_1 and M23_1 are connected to WL2_1 and to BL0-BL3, respectively, and memory cells M30_1, M31_1, M32_1 and M33_1 are connected to WL3_1 and to BL0-BL3, respectively. M30_1, connected to WL3_1 and BL0, is an example selected memory cell as denoted by the dashed line.

Each bit line and word line can be terminated by an open circuit as depicted by the circular terminals including example terminals 915 and 916 for BL0 and WL3_1, respectively, in one approach.

A transistor pair may be connected to each conductive line. For example, transistor pairs Wd0_1-Wd3_1 are connected in series with the word lines WL0_1 to WL3_1, respectively, and transistor pairs Bd0-Bd3 are connected in series with the bit lines BL0-BL3, respectively. Wd0_1-Wd3_1 can be used to select or unselect a respective word line and Bd0-Bd3 can be used to select or unselect a respective bit line. Wd0_1-Wd3_1 are word line decoder transistors and may be part of the row control circuitry 520, for example. Bd0-Bd3 are bit line decoder transistors and may be part of the column control circuitry 510, for example.

In one approach, each transistor decoder pair comprises a pMOSFET (depicted with a circle on the control gate) in parallel with an nMOSFET. For example, Wd0_1-Wd3_1 comprise pMOSFETs 940-943, respectively, and nMOSFETs 944-947, respectively. Bd0-Bd3 comprise nMOSFETs 960-963, respectively, and pMOSFETs 964-967, respectively. The transistors pairs for the word lines may be connected to a common path 910, while the transistors pairs for the bit lines may be connected to a common path 920. The common path 910 can be connected to a WL driver 524a (FIG. 5B), and the common path 920 can be connected to a BL driver 513G, such as in a write operation. The common paths can also be connected to the sense circuit 564 (FIG. 5A) such as in a read operation. Or, with one of the conductive lines driven at 0 V or ground, the other conductive line can be connected to the sense circuit 564 in a read operation.

To select the memory cell M30_1 for writing or reading, Wd3_1 and Bd0 are provided in a conductive state to apply a voltage/current to the memory cell. Within the transistor pair Wd3_1, one or both of the transistors 943 and 947 can be provided in a conductive state to connect a voltage/current from the path 910 to WL3_1 in a write operation, or to sense a voltage on WL3_1 via the path 910 in a read operation. Similarly, within the transistor pair Bd0, one or both of the transistors 960 and 964 can be provided in a conductive state to connect a voltage/current from the path 920 to BL0 in a write operation, or to sense a voltage on BL0 via the path 920 in a read operation. Generally, for enhancement type transistors, an nMOSFET is in a conductive state when a positive gate-to-source voltage is applied, and a pMOSFET is in a conductive state when a negative gate-to-source voltage is applied, where in both cases the magnitude of the gate-to-source voltage exceeds the Vth of the transistor. See also FIG. 10F to 10F.

The circuit also includes an isolation transistor connected to each word line and bit line. For example, WL0_1 to WL3_1 are connected to isolation standby transistors 930-933, respectively. A WL isolation transistor can be provided in a conductive state to pass an isolation standby voltage, e.g., 1.65 V, to a word line which is unselected in a write or read operation. The WL isolation transistors may be nMOSFETs, in one approach, and have a source connected to a common voltage on a path 920. For a selected word line, e.g., WL3_1, the isolation transistor 933 is provided in a non-conductive state to disconnect the isolation voltage from the word line. This allows a drive voltage/current or sensed voltage to pass through the transistor pair Wd3_1 in a write or read operation, respectively.

Similarly, BL0-BL3 are connected to isolation transistors 950-953, respectively. A BL isolation transistor can be provided in a conductive state to pass an isolation voltage, e.g., 1.65 V, to a bit line which is unselected in a write or read operation. The BL isolation transistors may be pMOSFETs, in one approach, and have a drain connected to a common voltage on a path 921. Such path 921 voltage may be the same as path 920 voltage.

For the selected bit line, BL0, the isolation transistor 950 is provided in a non-conductive state to disconnect the isolation voltage from the bit line. This allows a drive voltage/current or sensed voltage to pass through the transistor pair Bd0 in a write or read operation, respectively.

In one approach, the unselected memory cells which are connected to both unselected word lines and unselected bit lines can be biased at both of their terminals with an equal positive voltage (an isolation voltage) during a write operation to prevent the unselected memory cells from being written. An unselected memory cell is a memory cell which is not selected for a read or write operation. A selected memory cell is a memory cell which is selected for a read or write operation. The isolation voltage is sufficient to prevent unselected memory cells from being affected by a write or read operation of a selected memory cell; for example, at approximately the average of the minimum and maximum voltages applied to either the WL and BL during active operations, so that an unselected cell does not have more than Vth(selector) across it when unselected.

The pMOSFETs and nMOSFETs of the transistor pairs and isolation transistors can be provided in a conductive or non-conductive state by the row decoder control circuitry and column decoder control circuitry setting appropriate control gate voltages (Vcg). Within a transistor pair, the control gate voltage can be controlled independently for the pMOSFET and the nMOSFET. The control gates of the nMOSFET and pMOSFET can be controlled separately in each transistor pair, each transistor being able to be used to select or deselect that path.

Figure 9B:
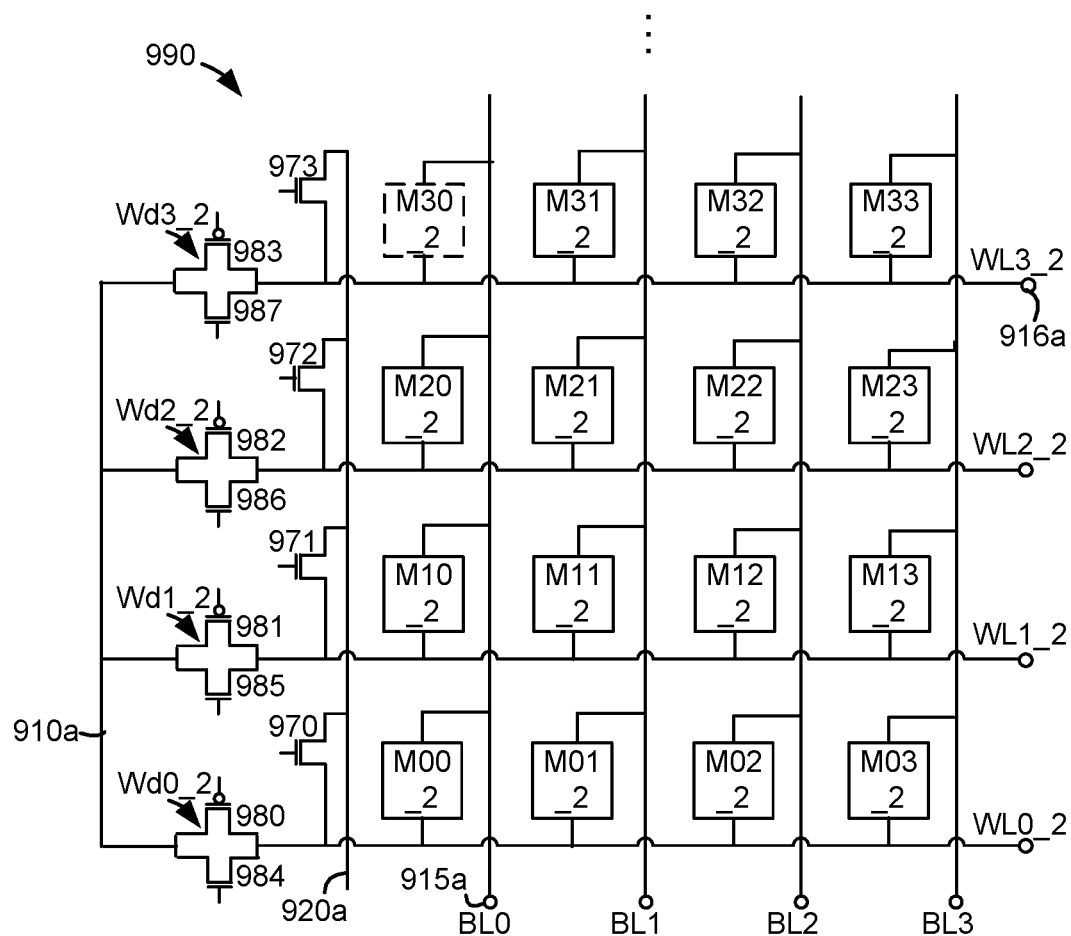
FIG. 9B depicts an example circuit consistent with FIG. 9A and the second level of the cross-point memory array 750 of FIG. 7B.

FIG. 9B depicts an example circuit 990 consistent with FIG. 9A and the second level of the cross-point memory array 750 of FIG. 7B. As mentioned in connection with FIG. 7B, the bit lines BL0-BL3 can be shared among the first and second levels of memory cells. The word line decoders can have a similar arrangement as for the first level. The word lines WL0_2 to WL3_2 are depicted along with the bit lines BL0-BL3. There are sixteen example memory cells. For example, memory cells M00_2, M01_2, M02_2 and M03_2 are connected to WL0_2 and to BL0-BL3, respectively, memory cells M10_2, M11_2, M12_2 and M13_2 are connected to WL1_2 and to BL0-BL3, respectively, memory cells M20_2, M21_2, M22_2 and M23_2 are connected to WL2_2 and to BL0-BL3, respectively, and memory cells M30_2, M31_2, M32_2 and M33_2 are connected to WL3_2 and to BL0-BL3, respectively. M30_2, connected to WL3_2 and BL0, is an example selected memory cell as denoted by the dashed line.

Each bit line and word line can be terminated by an open circuit as depicted by the circular terminals including example terminals 915*a* and 916*a* for BL0 and WL3_2, respectively, in one approach.

A transistor pair may be connected to each conductive line. For example, transistor pairs Wd0_2-Wd3_2 are connected in series with the word lines WL0_2 to WL3_2, respectively. Wd0_2-Wd3_2 can be used to select or unselect a respective word line and Bd0-Bd3 can be used to select or unselect a respective bit line. Wd0_2-Wd3_2 are word line decoder transistors and may be part of the row control circuitry 520, for example.

In one approach, each transistor decoder pair comprises a pMOSFET in parallel with an nMOSFET. For example, Wd0_2-Wd3_2 comprise pMOSFETs 980-983, respectively, and nMOSFETs 984-987, respectively. The transistors pairs for the word lines may be connected to a common path 910*a*. The common path 910*a* may be connected to a WL driver 524*a* (FIG. 5B), for example a current source providing, e.g., approximately 30 µA in a write operation for a 20 nm CD MRAM. Or, the common path 910*a* may be connected a current source providing, e.g., approximately 15 µA and to the sense circuit 564 (FIG. 5A), such as in a read operation.

To select the memory cell M30_2 for writing or reading, Wd3_2 and Bd0 are provided in a conductive state to apply a voltage across the memory cell. Within the transistor pair Wd3_2, one or both of the transistors 983 and 987 can be provided in a conductive state to connect a voltage/current from the path 910*a* to WL3_2 in a write operation, or to sense a voltage on WL3_2 at the path 910*a* in a read operation. Similarly, within the transistor pair Bd0 (FIG. 9A), one or both of the transistors 960 and 964 can be provided in a conductive state to connect a voltage/current from the path 920 to BL0 in a write operation, or to sense a voltage on BL0 at the path 920 in a read operation.

Additionally, WL0_2 to WL3_2 are connected to isolation transistors 970-973, respectively. The WL isolation transistors may be nMOSFETs, in one approach, and have a source connected to a common voltage on a path 920*a*. For a selected word line, e.g., WL3_2, the isolation transistor 973 is provided in a non-conductive state to disconnect the isolation voltage from the word line. This allows a drive voltage/current or sensed voltage to pass through the transistor pair Wd3_2 in a write or read operation, respectively.

The transistor pair connected to each conductive line (e.g., word line or bit line) provides an optimized bidirectional writing capability. As mentioned at the outset, both writing and reading can be optimized by providing one or both transistors in a conductive state. In particular, when selecting a memory cell, a voltage of a first conductive line such as WL3_1 may be pulled up (increased) to a positive voltage using a pMOSFET driven by a current source while a voltage of a second conductive line such as BL0 may be pulled down (decreased), e.g., to approximately 0 V using an nMOSFET, such as the nMOSFET 960 in Bd0 of FIG. 9A. This approach minimizes a capacitance while the selector is turned on by using only one transistor of the decoder pair, where a pMOSFET is able to pull the node higher than an nMOSFET since the loss of Vth is avoided. However, when reading the selected memory cell after the selector is on and the WL voltage is lower, in one option, the parallel nMOSFET of the first conductive line may also be used in parallel or alone. The nMOSFET adds a resistance which offsets a decreased resistance of the pMOSFET to allow accurate sensing of the voltage across the memory cell. The amplitude of the voltage which is sensed by the sense circuit is therefore preserved (or increased if the nMOSFET alone is used). In another option, when reading the selected memory cell, the pMOSFET is turned off while the parallel nMOSFET is turned on. This increases the total resistance of the transistor pair so that the voltage which is sensed by the sense circuit is amplified if the MRAM changes from LRS to HRS.

Figure 10A:
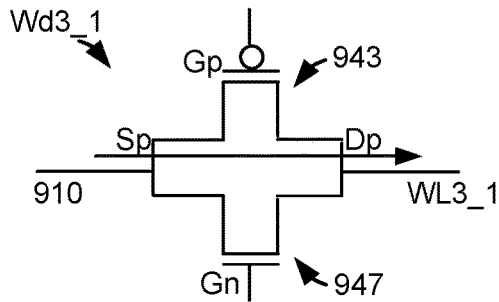
FIG. 10A depicts the WL transistor pair Wd3_1 of FIG. 9A in a configuration in which the pMOSFET is on and the nMOSFET is off when pulling up a voltage on a selected word line WL3_1.

FIG. 10A depicts the WL transistor pair Wd3_1 of FIG. 9A in a configuration in which the pMOSFET is on and the nMOSFET is off when pulling up a voltage on a selected word line WL3_1. The pulling up of the word line voltage can occur during a selecting process for a decoded bit's selector, or during writing, for instance. In one approach, the voltage is pulled up using a read current source to select the bit and a write current source to write the bit, each using the pMOSFET, such as in FIG. 5C. And the Read can be done with the pMOSFET. Or it can be with the p and nMOSFETs both on to improve difference signal to the sense amp from the MRAM changing state after the write for a self-referenced read (SRR). Or the signal may be further increased by reading with the nMOSFET only by turning off the pMOSFET and turning on the nMOSFET after the selector turns on.

Figure 10D:
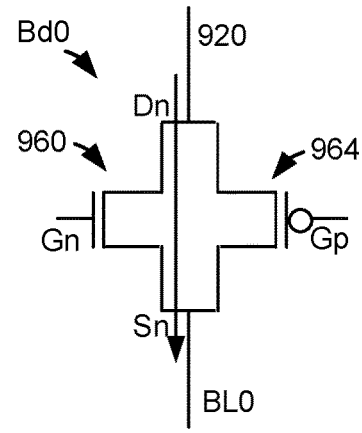
FIG. 10D depicts the WL transistor pair Wd3_1 of FIG. 9A in a configuration in which the pMOSFET is off and the nMOSFET is on when pulling up a voltage on a selected bit line BL0.
Figure 10B:
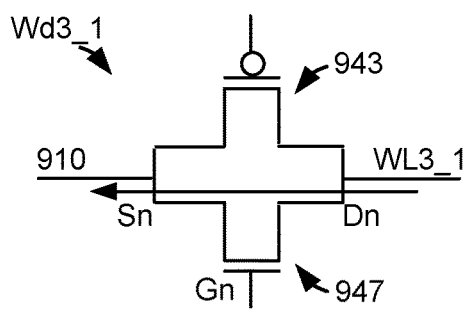
FIG. 10B depicts the WL transistor pair Wd3_1 of FIG. 9A in a configuration in which the pMOSFET is off and the nMOSFET is on when sensing a voltage on a selected word line WL3_1.
Figure 10E:
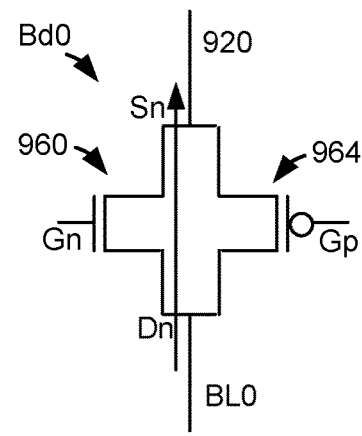
FIG. 10E depicts the WL transistor pair Wd3_1 of FIG. 9A in a configuration in which the pMOSFET is off and the nMOSFET is on during a sensing process in which the selected bit line BL0 is set to ground.
Figure 10C:
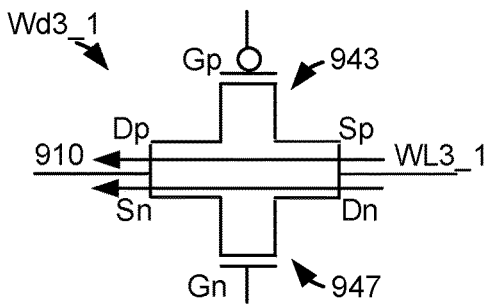
FIG. 10C depicts the WL transistor pair Wd3_1 of FIG. 9A in a configuration in which the pMOSFET is on and the nMOSFET is on when sensing a voltage on a selected word line WL3_1.

In FIG. 10A-10C, the transistor pair Wd3_1 comprises the pMOSFET 943 in parallel with the nMOSFET 947. In FIG. 10A-10F, the control gate, drain and source of the pMOSFETs are denoted by Gp, Dp and Sp, respectively, and the control gate, drain and source of the nMOSFETs are denoted by Gn, Dn and Sn, respectively. Further, the pMOSFET and the nMOSFET may act as pass gates in some configurations.

The arrow passes through the pMOSFET from the common path 910 to WL3_1, representing a current flow direction from source (Sp) to drain (Dp). As mentioned, a pMOSFET is in a conductive state when a negative gate-to-source voltage is applied which exceeds, in magnitude, the Vth of the transistor. This could be achieved, e.g., by applying 0 V to the gate (Gp) and a positive voltage such as greater than 1 V to the source, assuming a Vth of 1 V, for example. The nMOSFET is in a non-conductive state when a gate-to-source voltage does not exceed the Vth. This could be achieved, e.g., by applying 0 V to the gate.

FIG. 10B depicts the WL transistor pair Wd3_1 of FIG. 9A in a configuration in which the pMOSFET is off and the nMOSFET is on when sensing a voltage on a selected word line WL3_1. During sensing, a voltage of WL3_1 is sensed by the sense circuit via the common path 910 and the transistor pair Wd3_1 and, in particular, via the nMOSFET 947, in this example. The pMOSFET is turned off, e.g., by applying 3.3 V to the gate (Gp). The nMOSFET is turned on, e.g., by applying 3.3 V to the gate (Gn). The arrow passes through the nMOSFET from WL3_1 to the common path 910, representing a current flow direction from drain (Dn) to source (Sn).

FIG. 10C depicts the WL transistor pair Wd3_1 of FIG. 9A in a configuration in which the pMOSFET is on and the nMOSFET is on when sensing a voltage on a selected word line WL3_1. During sensing, a voltage of WL3_1 is sensed by the sense circuit via the common path 910 and the transistor pair Wd3_1 and, in particular, via the nMOSFET 947 and the pMOSFET 943, in this example. The pMOSFET is turned on, e.g., by applying 0 V to the gate (Gp). The voltage on Wd3_1 is a positive voltage at the source of the pMOSFET and is assumed to be high enough to provide |Vgs|>Vth. The nMOSFET is turned on, e.g., by applying 3.3 V to the gate (Gn). The voltage on Wd3_1 is a positive voltage at the drain (Dn) of the nMOSFET and may be lower than the control gate voltage (Gn). With the two transistors in parallel, Dp is the same as Sn, and Sp is the same as Dn.

FIG. 10D depicts the WL transistor pair Wd3_1 of FIG. 9A in a configuration in which the pMOSFET is off and the nMOSFET is on when pulling down a selected bit line BL0, such to approximately 0 V. The pulling down of the bit line voltage can occur during a selecting process for a decoded bit's selector, or during read or writing of that bit, for instance. The selecting or writing can be bidirectional, as mentioned. Accordingly, in one direction, the word line is biased higher than the bit line, and in the opposite direction, the bit line is biased higher than the word line. When the bit line is biased higher, for example, it can be driven by the pMOSFET.

Figure 10F:
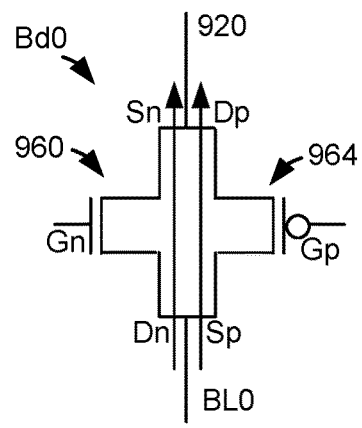
FIG. 10F depicts the WL transistor pair Wd3_1 of FIG. 9A in a configuration in which the pMOSFET is on and the nMOSFET is on during a sensing process in which the selected bit line BL0 is set to ground.

In FIG. 10D-10F, the transistor pair Bd0 comprises the pMOSFET 964 in parallel with the nMOSFET 960.

The arrow passes through the nMOSFET from the common path 920 to BL0, representing a current flow direction from drain (Dn) to source (Sn). This could be achieved, e.g., by applying 3.3 V to the gate of the nMOSFET. The pMOSFET is turned off, e.g., by applying 3.3 V to the gate.

FIG. 10E depicts the WL transistor pair Wd3_1 of FIG. 9A in a configuration in which the pMOSFET is off and the nMOSFET is on during a sensing process in which the selected bit line BL0 is set to ground. During one option for sensing, a voltage of BL0 can be grounded, e.g., set to 0 V, at the common path 920. The pMOSFET is turned off, e.g., by applying 3.3 V to the gate, and the nMOSFET is turned on, e.g., by applying 3.3 V to the gate. The arrow passes through the nMOSFET from BL0 to the common path 920, representing a current flow direction from drain (Dn) to source (Sn).

FIG. 10F depicts the WL transistor pair Wd3_1 of FIG. 9A in a configuration in which the pMOSFET is on and the nMOSFET is on during a sensing process in which the selected bit line BL0 is set to ground. In this option, the pMOSFET is turned on, e.g., by applying 0 V to the gate and the nMOSFET is turned on, e.g., by applying 3.3 V to the gate.

Figure 11A:
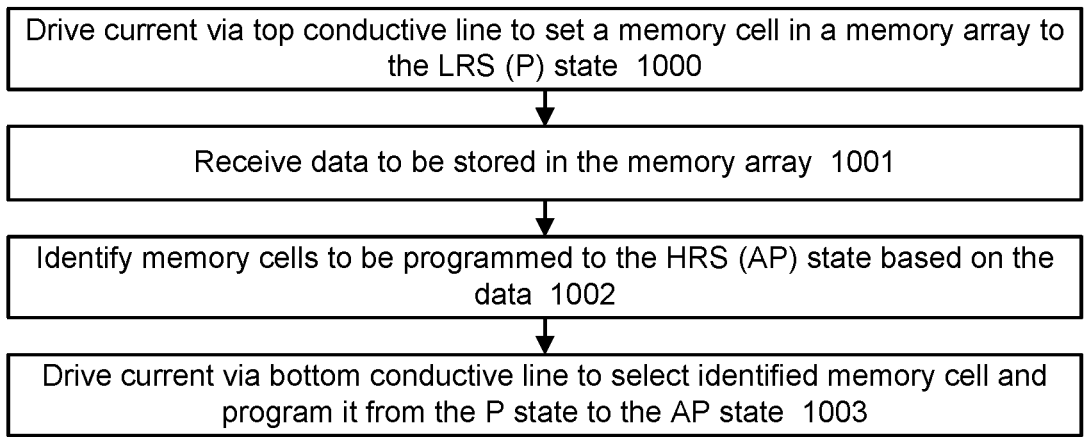
FIG. 11A depicts a flowchart of an example process for performing a write operation for a selected memory cell such as the memory cell 700 of FIG. 7A.

FIG. 11A depicts a flowchart of an example process for performing a write operation for a selected memory cell such as the memory cell 700 of FIG. 7A. Step 1000 includes driving a current via a top conductive line to set a memory cell in a memory array to the LRS (P) state. Repeating this at all memory locations will put all the bits in the LRS state. In this approach, all of the memory cells are in the same known state. The bottom conductive line can be set at a fixed voltage, in one approach. Step 1001 includes receiving data to be stored in the memory array. For example, the data can be received via a communication interface. Step 1002 includes identifying memory cells to be programmed to the HRS (AP) state based on the data. For example, these can be bits intended to store a 1 bit. Step 1003 includes driving a current via the bottom conductive line to select the identified memory cell and program it from the P state to the AP state. The top conductive line can be set at a fixed voltage, in one approach. The reference to the top and bottom conductive lines is consistent with the memory cell configuration of FIG. 7A. See also FIGS. 13A and 13B.

Figure 11B:
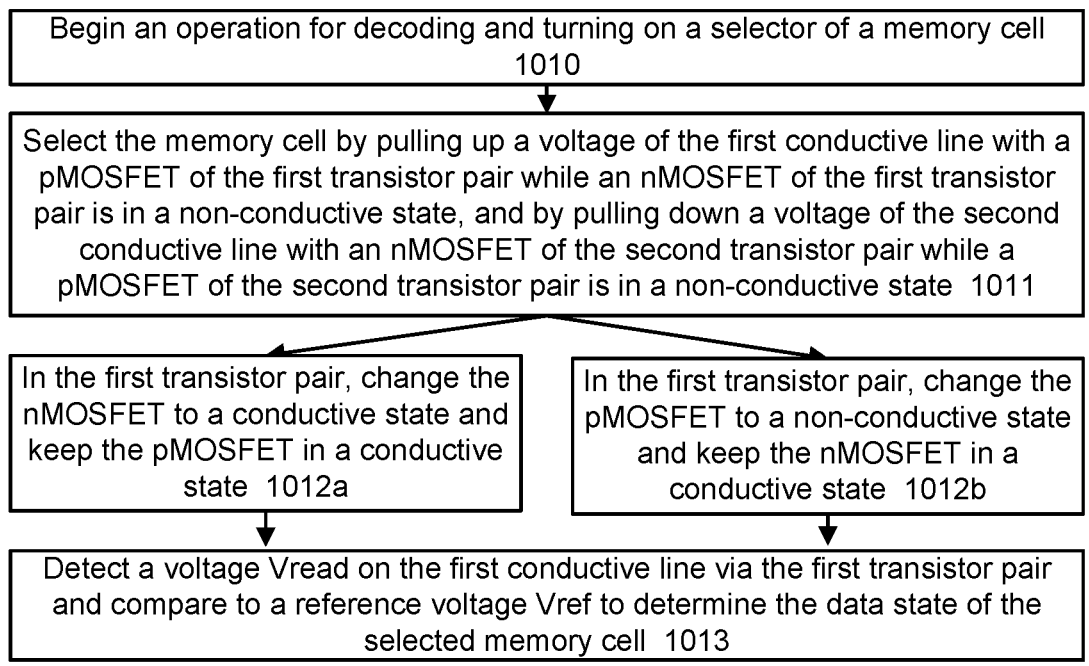
FIG. 11B depicts a flowchart of an example process for performing a read operation with a single voltage detection for a selected memory cell such as the memory cell 700 of FIG. 7A.

FIG. 11B depicts a flowchart of an example process for performing a read operation with a single voltage detection for a selected memory cell such as the memory cell 700 of FIG. 7A. The process can apply to L1 or L2 of FIG. 7B, for example. Step 1010 involves beginning an operation for decoding and turning on a selector of a memory cell. A first conductive line can be connected to a first end of the memory cell and to a first transistor pair, and a second conductive line can be connected to a second end of the memory cell and to a second transistor pair. For example, in FIG. 9A, where M30_1 is the selected memory cell in L1, the first conductive line is WL3_1 connected to the first transistor pair Wd3_1, and the second conductive line is BL0 connected to the second transistor pair Bd0. In another example, in FIG. 9B, where M30_2 is the selected memory cell in L2, the first conductive line is BL0 and connected to the first transistor pair Bd0 and the second conductive line is WL3_2 connected to the second transistor pair Wd3_2.

Step 1011 includes selecting the memory cell by pulling up a voltage of the first conductive line with a pMOSFET of the first transistor pair while an nMOSFET of the first transistor pair is in a non-conductive state, and by pulling down a voltage of the second conductive line with an nMOSFET of the second transistor pair while a pMOSFET of the second transistor pair is in a non-conductive state. The pulling up the voltage of the first conductive line can involve applying a current Iread to the first conductive line, as depicted in FIGS. 13C and 13D. The pulling down the voltage of the second conductive line can involve driving the second conductive line to near 0 V. The selecting can switch a selector of the memory cell from a non-conductive state to a conductive state, as mentioned. For example, consistent with FIG. 8C, a voltage can be applied across the memory cell which increases from 0 V to Vth(selector). See FIGS. 13C and 13D at t1-t2. The selecting step 1011 use a read current source to provide desired voltages and currents on a word line and bit line.

Generally, an MRAM cross-point array can select over a wider Vth range of the selector by using a pMOSFET for the conductive line which is pulled up in voltage than an nMOSFET for the conductive line since the pMOSFET can pull close to the positive power supply, whereas the nMOSFET can pull to the positive power supply minus its Vth, a loss of about 1 V in range. If the memory cells have the same orientation in each layer, the conductive line which is pulled up in voltage may be a first conductive line below the memory cell and the conductive line which is pulled down in voltage may be a second conductive line above the memory cell in the first level. The turn on of the selector induces a transient voltage across the memory cell as the excess voltage is bled off through the storage element. The internal series resistance of the memory cell is on the order of 20 kΩ. The excess voltage is Vth-Vhold, which can be reduced if Vhold is increased or if capacitance and Vth are reduced. To minimize a risk of reversing the state of the storage element due to the energy of the excess voltage, the transient duration should be minimized by reducing capacitance.

The bit line tends to have a larger capacitance due to its longer length and placement between the two layers, as in FIG. 7B, so the dissipation time is mostly set by the word line capacitance. The bleed off time and read latency can be reduced by reducing the capacitance. One option is to shorten the length and increase the tile wire-to-wire spacing. Another option is to reduce the size of the transistor used to drive the tile wire. Another option is to select the word line with an nMOSFET and the higher capacitance bit line with a pMOSFET, since the nMOSFET on the word line can be three times smaller for the equivalent drive. Pulling high with the pMOSFET and pulling low with the nMOSFET allows for the widest range of allowed Vth for a given power supply since the loss of Vth in the drive transistors is avoided. However, these approaches are problematic. For example, the fabrication of a multi-level memory device is simplified if the memory cells in each level have the same orientation. In this case, one of the levels must pull the word line high with a pMOSFET and the other level pulls the word line low with an nMOSFET to obtain a higher allowed Vth(selector).

Selecting with a single n or pMOSFET alone reduces capacitance and allows for a higher Vth but reduces the signal difference when the storage element changes its state. For example, if the memory cell has a resistance of 25 kΩ in the LRS and 50 kΩ in the HRS, and read current Iread is 15 μA, the voltage across the memory cell is 375 mV in the LRS and 750 mV in the HRS. This is a signal difference of 375 mV across the MRAM between the two states. However, the drain-to-source resistance, Rds, of the MOSFET is reduced from a larger Von as a result of the HRS of the memory cell increasing the voltage at the sense circuit. As a result, the signal difference could decrease to, e.g., 250-300 mV, making it more difficult to detect the change of state of the memory cell during reading.

Two options are provided for optimizing the signal at the sense circuit. A first option (step 1012a) involves selecting the selector with only one transistor for reduced capacitance, using a pMOSFET, for example, on Level 1, to allow a higher Vth, and then turning on the available nMOSFET during reading while keeping the pMOSFET on. In this case, during reading, the increased Von of the pMOSFET is offset by the decreased Von of the nMOSFET so that the overall resistance remains approximately constant and approximately the full signal difference is passed to the sense circuit.

A second option (step 1012b) involves selecting the selector with only one transistor for reduced capacitance, using a pMOSFET on Level 1 to allow a higher Vth, and then turning on the available nMOSFET during reading while turning off the pMOSFET after the selector is on, thereby using only one transistor to select in order to reduce capacitance during the turn-on. The choice being the pMOSFET to allow a wider range of Vth(selector) during selection. Then, after selection converting to only the nMOSFET for read and level store during the first read of a SRR. The higher resistance of the nMOSFET results in higher signal at the sense circuit. This approach is suitable when the resistance-area (RA) product of the memory cell is relatively low, such as five or lower. If the RA is relatively high, such as ten or greater, the signal at the sense circuit may become too high, exceeding the range of the sense circuit or the power supply. Then, turning on both may be preferable.

In the first option, step 1012a includes, in the first transistor pair, changing the nMOSFET to a conductive state and keeping the pMOSFET in a conductive state. In one approach, after the selecting of the memory cell, and in preparation for the read of the memory cell, a control circuit is configured to change the nMOSFET from the non-conductive state to the conductive state and to keep the pMOSFET in the conductive state.

In the second option, step 1012b includes, in the first transistor pair, after selector turn-on, changing the pMOSFET to a non-conductive state and keeping the nMOSFET in a conductive state. For consistency, the first and second reads before and after the destructive write of the SRR, should use the same option. In one approach, after the selecting of the memory cell, and in preparation for the read of the memory cell, a control circuit is configured to change the pMOSFET from the conductive state to the non-conductive state and to turn on the nMOSFET into the conductive state.

The common step 1013 includes detecting a voltage Vread on the first conductive line via the first transistor pair and comparing it to a reference voltage Vref. See the example sense circuit of FIG. 12A. See also FIGS. 13C and 13D at t2-t3.

Figure 11C:
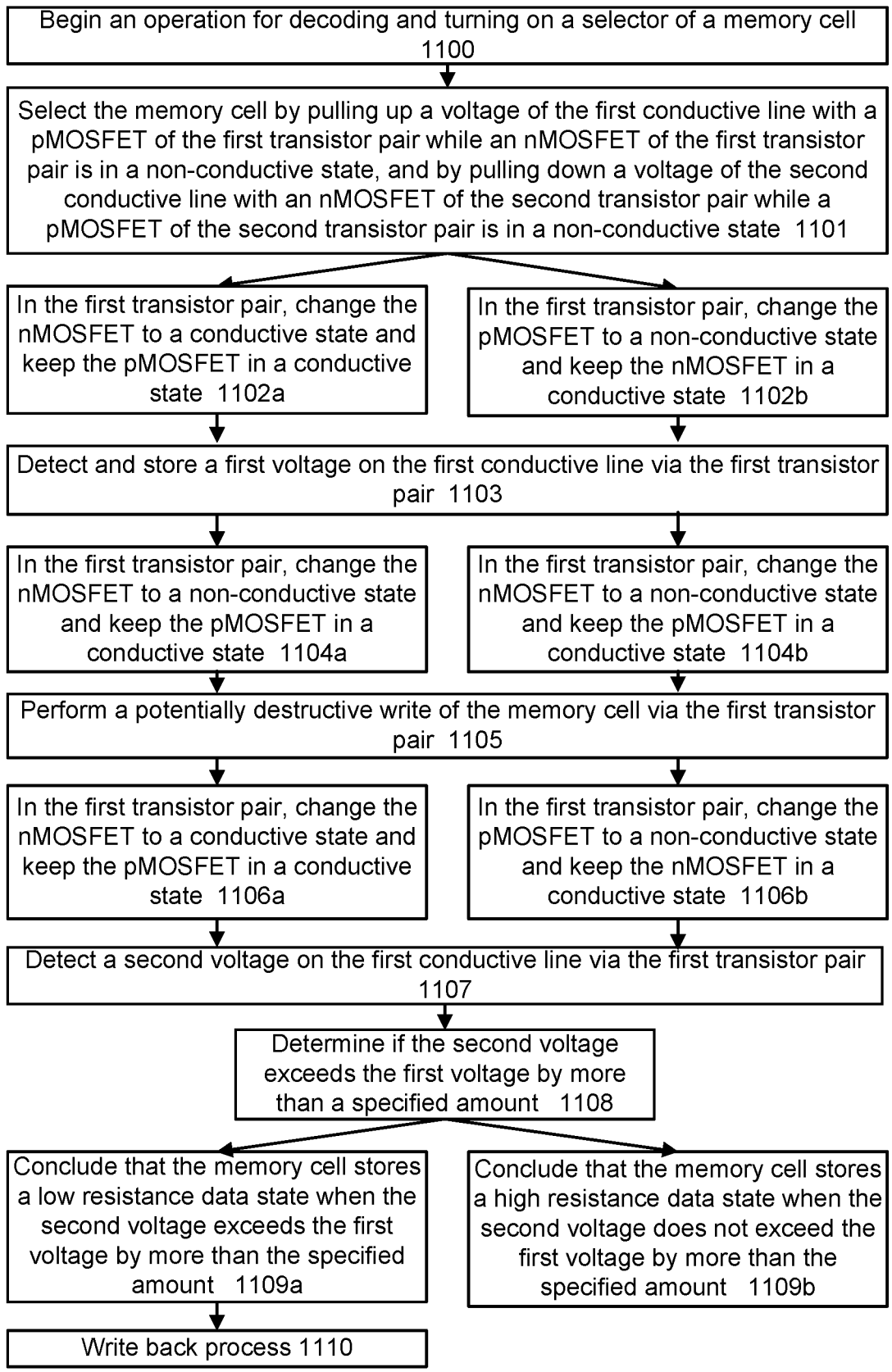
FIG. 11C depicts a flowchart of an example process for performing a read operation with a dual voltage detection for a selected memory cell such as the memory cell 700 of FIG. 7A.

FIG. 11C depicts a flowchart of an example process for performing a read operation with a dual voltage detection for a selected memory cell such as the memory cell 700 of FIG. 7A. Steps 1100, 1101, 1102a and 1102b correspond to steps 1010, 1011, 1012a and 1012b, respectively, of FIG. 11B. See FIGS. 13E and 13F where the selecting of step 1101 occurs at t1-t2.

The first option involves steps 1102a, 1104a and 1106a, while the second option involves steps 1102b, 1104b and 1106b.

In this dual voltage sensing approach, a first voltage is detected at step 1103 and a second voltage is detected at step 1107. In particular, the common step 1103 includes detecting and storing a first voltage on the first conductive line via the first transistor pair. For example, the first voltage Vread1 can be stored in the first capacitor C1 of the sense circuit of FIG. 12B. See also FIGS. 13E and 13F at t2-t3.

In the first option, step 1104a includes, in the first transistor pair, changing the nMOSFET to a non-conductive state and keeping the pMOSFET in a conductive state. In one approach, after the detecting of the first voltage, and in preparation for the potentially destructive write of the memory cell, a control circuit is configured to change the nMOSFET from the conductive state to the non-conductive state and to keep the pMOSFET in the conductive state.

In the second option, step 1104b includes, in the first transistor pair, changing the nMOSFET to a non-conductive state and keeping the pMOSFET in a conductive state. In one approach, after the detecting of the first voltage, and in preparation for the potentially destructive write of the memory cell, a control circuit is configured to change the nMOSFET from the non-conductive state to the conductive state and to keep the pMOSFET in the conductive state.

The common step 1105 includes performing a potentially destructive write of the memory cell via the first transistor pair. This write operation ensures that the memory cell is in the HRS. If the memory cell is already in the HRS, the write is non-destructive. However, if the memory cell is in the LRS, the write is destructive because it changes the data state of the memory cell. See also FIGS. 13E and 13F at t3-t5.

In the first option, step 1106a includes, in the first transistor pair, changing the nMOSFET to a conductive state and keeping the pMOSFET in a conductive state. In one approach, after the potentially destructive write of the memory cell, and in preparation for the detecting of the second voltage, the control circuit is configured to change the nMOSFET from the non-conductive state to the conductive state and to keep the pMOSFET in the conductive state.

In the second option, step 1106b includes, in the first transistor pair, changing the pMOSFET to a non-conductive state and keeping the nMOSFET in a conductive state. In one approach, after the potentially destructive write of the memory cell, and in preparation for the detecting of the second voltage, the control circuit is configured to change the pMOSFET from the conductive state to the non-conductive state and to keep the nMOSFET in the conductive state.

The common step 1107 includes detecting a second voltage (Vread2) on the first conductive line via the first transistor pair. For example, the second voltage can be provided to the inverting input (-) of the comparator 1201 of the sense circuit of FIG. 12B.

The common step 1108 includes determining if the second voltage exceeds the first voltage by more than a specified amount. In one approach, a second capacitor C2 stores an offset voltage Voffset which can be added to Vread1 by connecting C1 and C2 in series using a switch 1202. The combined input, Vread1+Voffset, is then provided to the non-inverting input of the comparator for comparison with Vread2. By adding an offset voltage, a more reliable determination can be made of whether the memory cell switches from the LRS to the HRS in step 1105.

Based on step 1108, step 1109a or 1109b is reached. Step 1109a concludes that the memory cell stores a low resistance data state when the second voltage exceeds the first voltage by more than the specified amount, and step 1109b concludes that the memory cell stores a high resistance data state when the second voltage does not exceed the first voltage by more than the specified amount. Step 1110 depicts a write back process which follows step 1109a, where a memory cell which has been changed its state due to the destructive write process is restored to its original state. See also FIGS. 13G and 13H.

Figure 12A:
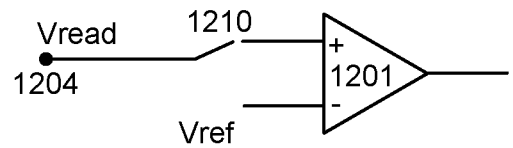
FIG. 12A depicts an example implementation of the sense circuit 564 of FIG. 7B, consistent with the process of FIG. 11B.

FIG. 12A depicts an example implementation of the sense circuit 564 of FIG. 7B, consistent with the process of FIG. 11B. The sense circuit include a comparator 1201. A reference voltage Vref is provided to the inverting input and a detected voltage Vread on the common path 1204 is provided to the non-inverting input when a switch 1210 is closed. Vref can be set at a level between a voltage which is expected for a LRS memory cell, V_LRS, and a voltage which is expected for a HRS memory cell, V_HRS. An output of the comparator thus indicates the data state of the memory cell.

Figure 12B:
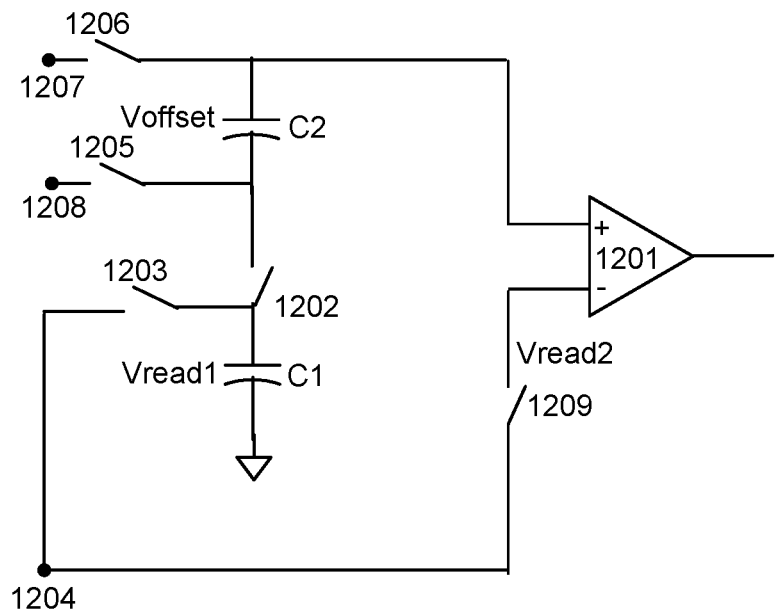
FIG. 12B depicts another example implementation of the sense circuit 564 of FIG. 7B, consistent with the process of FIG. 11C.

FIG. 12B depicts another example implementation of the sense circuit 564 of FIG. 7B, consistent with the process of FIG. 11C. As mentioned in connection with FIG. 11C, the sense circuit can include a first capacitor C1 which stores a first voltage Vread1 on a selected memory cell, and a second capacitor C2 which stores an offset voltage Voffset. In an example, Vread1 is 375 mV in the LRS and 750 mV in the HRS, and Voffset is 100-150 mV. Prior to sensing, C1 can be charged up to Voffset by applying a corresponding voltage across the nodes 1207 and 1208, and closing (making conductive) the switches 1205 and 1206. These switches can then be opened (made non-conductive) to maintain Voffset in C2.

The node 1204 can be connected to the common path 910 of FIG. 9A. During sensing, the common path is connected to a selected word line such as WL3_1 via the transistor pair Wd3_1. This allows the voltage of the word line to be conveyed to the node 1204. The switch 1203 is closed while the switch 1202 is opened to provide Vread1 across C1. Subsequently, the switch 1203 is opened to disconnect C1 from the word line. The switch 1202 is then closed to provide C2 in series with C1. C2 is connected to the non-inverting input of a comparator 1201, in one approach. To obtain Vread2, the switch 1209 is closed while the switch 1203 is opened to connect the node 1204 to the inverting input of the comparator. Alternatively, a capacitor can be connected with an end tied to the stored level voltage also on a capacitor. The other end of the capacitor can be driven positive when used in a sense amp to adjust the voltage up approximately 150 mV for Level 1, for example if the SRR is P2AP. Or, the other terminal of the capacitor can be driven negative to move the stored voltage −150 mV for Level 1, for example, if the SRR is P2AP. Or, the direction of bump can be reversed if the SRR is AP2P.

Figure 12C:
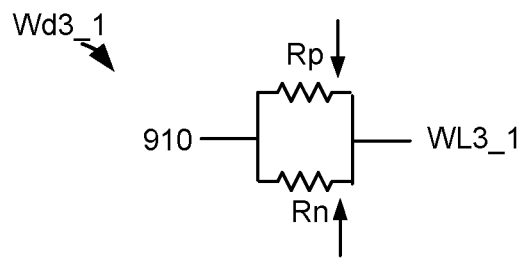
FIG. 12C depicts example resistances in parallel of the pMOSFET and nMOSFET of the transistor pair Wd3_1, consistent with FIG. 9A.

FIG. 12C depicts example resistances in parallel of the pMOSFET and nMOSFET of the transistor pair Wd3_1, consistent with FIG. 9A. The pMOSFET and the nMOSFET have resistances of Rp and Rn, respectively, when they are in a conductive state, and the total resistance Rt of the transistor pair is governed by: 1/Rt=1/Rp+1/Rn. As mentioned above, in a first option, a reduced resistance of the pMOSFET, Rp (represented by a downward arrow), can be offset by an increased resistance of the nMOSFET, Rn (represented by an upward arrow) when both transistors are in the conductive state. This preserves the signal amplitude. In a second option, which increases the signal amplitude, the reduced resistance of the pMOSFET, Rp, is replaced by the increased resistance of the nMOSFET, Rn, when the pMOSFET is in the non-conductive state and the nMOSFET is in the conductive state. Thus, a decreased resistance of the pMOSFET caused by the selecting of the memory cell is offset by a resistance of the nMOSFET when the nMOSFET is in the conductive state. Also, a decreased resistance of the pMOSFET caused by the selecting of the memory cell is replaced by a resistance of the nMOSFET when the nMOSFET in the conductive state.

Figure 13A:
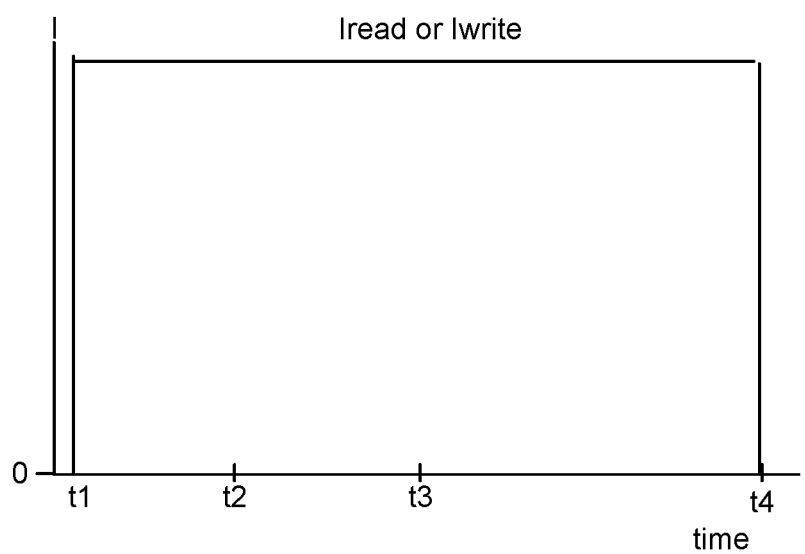
FIG. 13A depicts an example plot of current versus time for a memory cell, consistent with the write process of FIG. 11A.
Figure 13B:
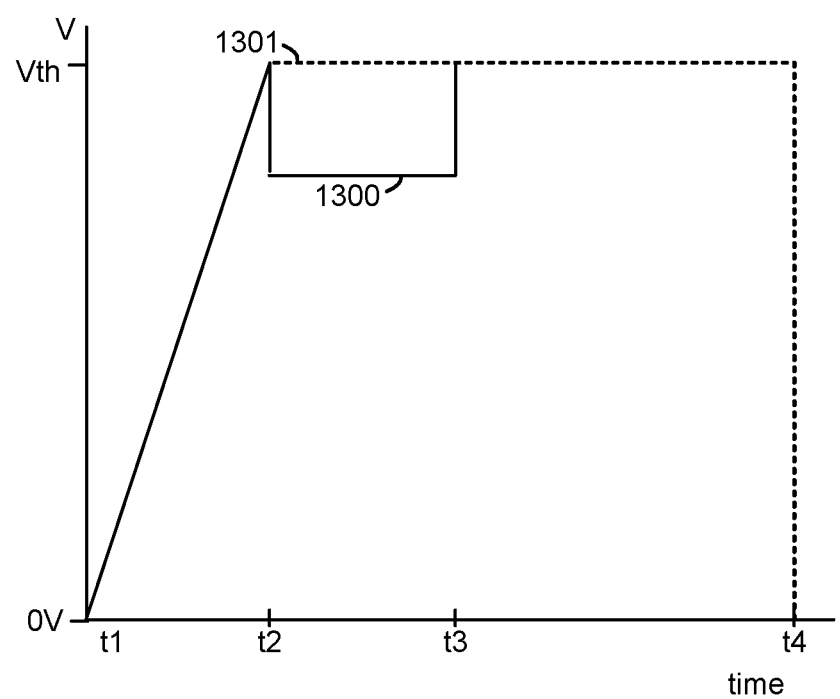
FIG. 13B depicts an example plot of voltage versus time for a memory cell, consistent with FIG. 13A.
Figure 13C:
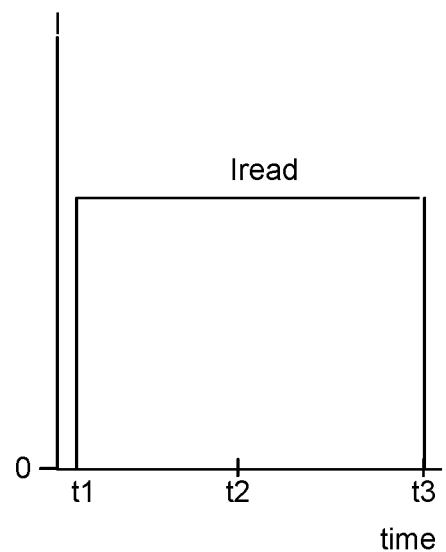
FIG. 13C depicts an example plot of current versus time for a memory cell, consistent with the read process of FIG. 11B.
Figure 13D:
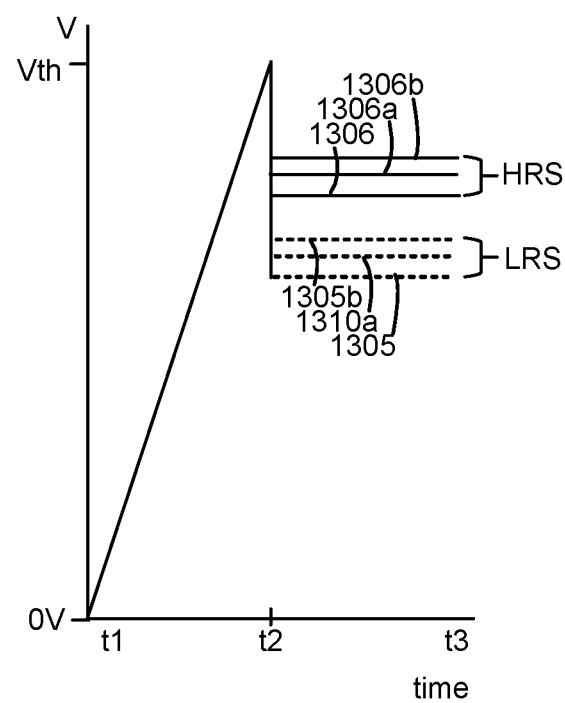
FIG. 13D depicts an example plot of voltage versus time for a memory cell, consistent with FIG. 13C.

FIG. 13A depicts an example plot of current versus time for a memory cell, consistent with the write process of FIG. 11A. FIG. 13B depicts an example plot of voltage versus time for a memory cell, consistent with FIG. 13A. The selecting of the memory cell occurs at t1-t2. A current Iread is driven on one of the conductive lines, consistent with step 1000 until the resistance of the selector switches to a lower level at t2. At this time, there is a drop off in voltage to the level of plot 1300 if the memory cell is in the LRS. Or, the voltage is maintained at the level of plot 1301 if the memory cell is in the HRS. The selection process could be with a write current if write is desired; however, bit endurance may improve by always selecting with a read current and then increasing the current to a write current. The LRS memory cell switches to the HRS at t3, and the process ends at t4.

FIG. 13C depicts an example plot of current versus time for a memory cell, consistent with the read process of FIG. 11B. FIG. 13D depicts an example plot of voltage versus time for a memory cell, consistent with FIG. 13C. The selecting of the memory cell occurs at t1-t2. A current Iread, lower than Iwrite, is driven on one of the conductive lines, consistent with step 1011 until the resistance of the selector switches to a lower level at t2. At this time, there is a drop off in voltage to a level which is based on whether the memory cell is in the LRS or the HRS, and based on the configuration of the transistor pair. In particular, for the LRS, the voltages of plots 1305, 1305a and 1305b are obtained if the pMOSFET only is on, both the nMOSFET and pMOSFETs are on, or the nMOSFET only is on, respectively. For the HRS, the voltages of plots 1306, 1306a and 1306b are obtained if the pMOSFET only is on, both the nMOSFET and pMOSFETs are on, or the nMOSFET only is on, respectively. The detecting of the voltage Vread occurs at t2-t3, consistent with step 1013, and the process ends at t3.

Figure 13E:
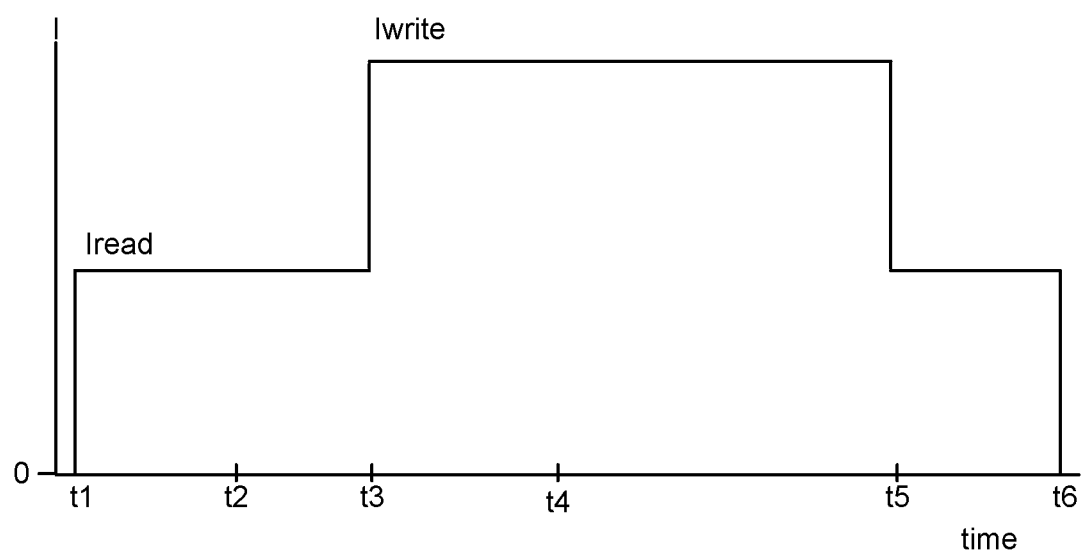
FIG. 13E depicts an example plot of current versus time for a memory cell, consistent with the process of FIG. 11C, steps 1100-1108.
Figure 13F:
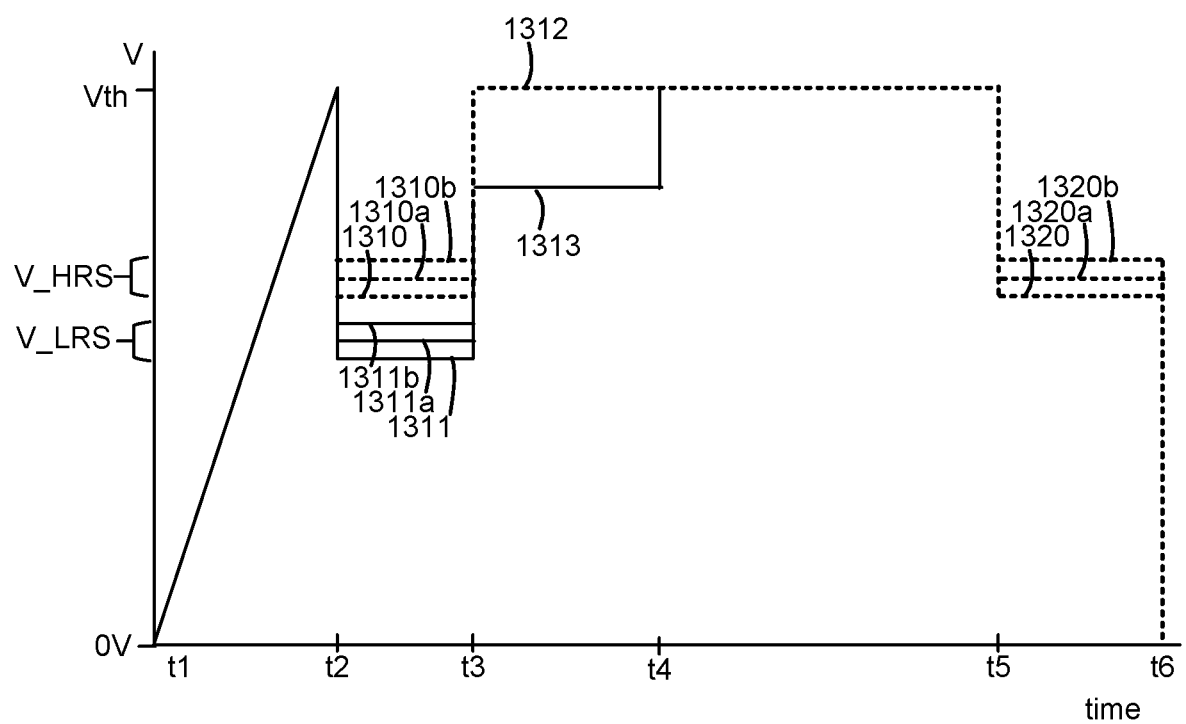
FIG. 13F depicts an example plot of voltage versus time for a memory cell, consistent with FIG. 13E.

FIG. 13E depicts an example plot of current versus time for a memory cell, consistent with the process of FIG. 11C, steps 1100-1108. FIG. 13F depicts an example plot of voltage versus time for a memory cell, consistent with FIG. 13E. The selecting of the memory cell occurs at t1-t2. During this time, the memory cell is driven with a fixed current of, e.g., 15 µA, referred to as Iread, while a voltage ramps up to, e.g., Vth=3 V, to select the memory cell. At t2, the selector changes from its non-conductive state to its lower resistance, conductive state, causing a drop in voltage towards Vhold(selector). At t2-t3, the plots represent the voltage V_HRS or V_LRS across the memory cell if it is in the HRS (the AP state) or the LRS (the P state), respectively. In particular, for the LRS, the voltages of plots 1311, 1311a and 1311b are obtained if the pMOSFET only is on, both the nMOSFET and pMOSFETs are on, or the nMOSFET only is on, respectively. For the HRS, the voltages of plots 1310, 1310a and 1310b are obtained if the pMOSFET only is on, both the nMOSFET and pMOSFETs are on, or the nMOSFET only is on, respectively. Vread1 can be detected from t2-t3.

From t3-t5, the potentially destructive write occurs by driving a higher fixed current of Iwrite, e.g., 30 µA. From t3-t4, the plot 1312 represents the case where the memory cell is in the HRS and the plot 1313 represents the case where the memory cell is in the LRS. At t4, the memory cell in the LRS switches to the HRS in a destructive write process, or the memory cell in the HRS remains in the HRS. At t5-t6, the current is lowered to Iread and Vread2 is obtained for comparison with Vread1. In particular, the voltages of plots 1320, 1320a and 1320b are obtained if the pMOSFET only is on, both the nMOSFET and pMOSFETs are on, or the nMOSFET only is on, respectively. The data state of the memory cell is determined by t6, at which time the process is completed by comparison to the level stored during the first read and adjusted up by 150 mV (Voffset).

Figure 13G:
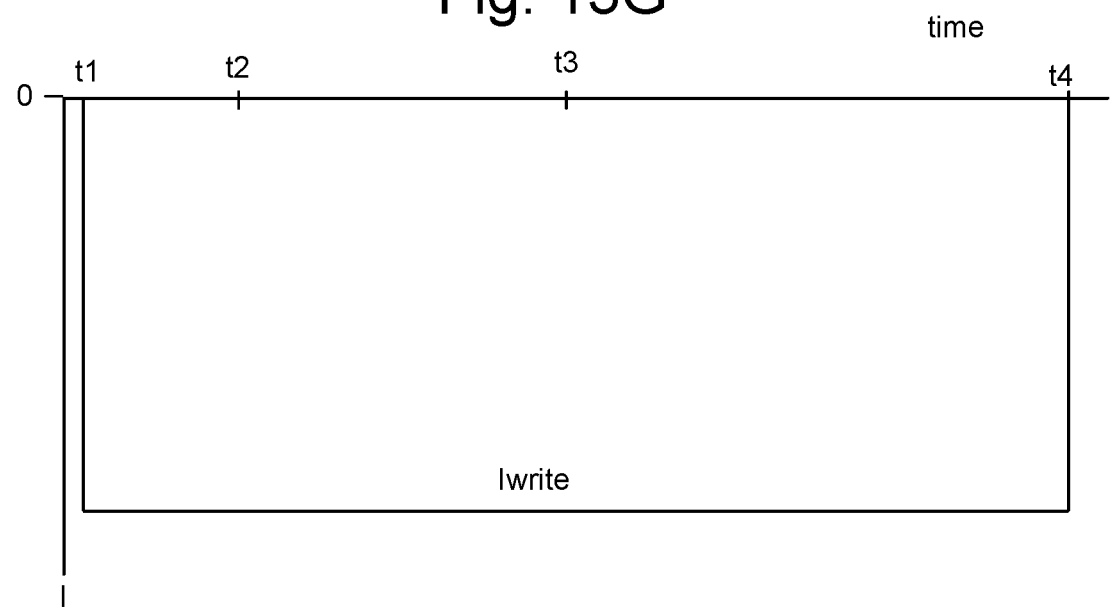
FIG. 13G depicts an example plot of current versus time for a memory cell, consistent with the write back process of FIG. 11C, step 1110.
Figure 13H:
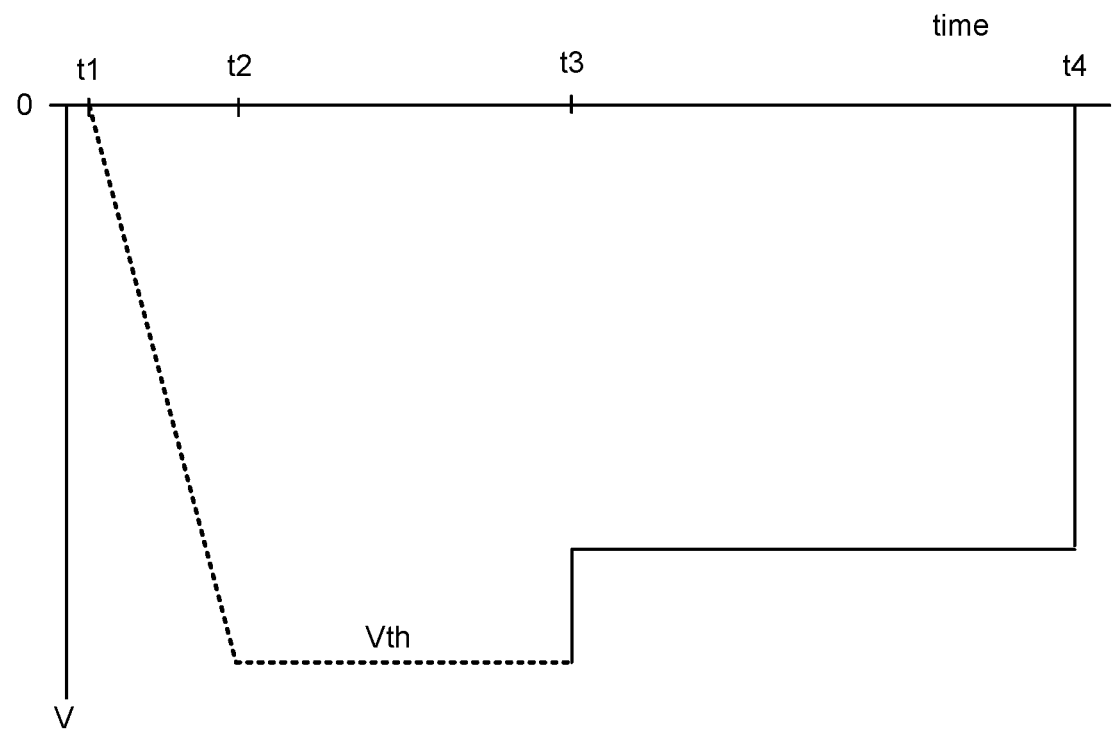
FIG. 13H depicts an example plot of voltage versus time for a memory cell, consistent with FIG. 15A.

FIG. 13G depicts an example plot of current versus time for a memory cell, consistent with the write back process of FIG. 11C, step 1110. FIG. 13H depicts an example plot of voltage versus time for a memory cell, consistent with FIG. 13G. The current Iwrite is through the memory cell and may have a magnitude of, e.g., 30 µA. This current is driven to perform an AP2P write for a target cell in the AP state. At t1-t2, Iwrite is applied and the voltage ramps from 0 V to, e.g., –3 V, to select the memory cell and remains at –3 V from t2-t3 –3 V could be the Vth of the selector. At t3, the AP state cell switches to the P state, so that the magnitude of the voltage drops. The process ends at t4.

In one approach, an apparatus comprises: a control circuit configured to connect to a cross-point memory array, the cross-point memory array comprising a memory cell arranged between a first conductive line and a second conductive line, and a first transistor pair comprising a pMOSFET in parallel with an nMOSFET and connected to the first conductive line, the memory cell comprising a storage element in series with a threshold switching selector; the control circuit, to select the memory cell, is configured to pull up a voltage of the first conductive line with the pMOSFET while the nMOSFET is in a non-conductive state; and the control circuit is configured to subsequently read the memory cell while the pMOSFET is in a non-conductive state and the nMOSFET is in a conductive state.

In another approach, a method comprises: switching a threshold switching selector of a memory cell from a high resistance state to a low resistance state, wherein a first conductive line is connected to a first end of the memory cell and a second conductive line connected to a second end of the memory cell, and a first transistor pair comprising a pMOSFET in parallel with an nMOSFET is connected to the first conductive line, the switching comprising setting a voltage of the first conductive line with the pMOSFET while keeping the nMOSFET is in a non-conductive state; and when the threshold switching selector is in the low resistance state, sensing a first voltage on the first conductive line via the first transistor pair while the pMOSFET is in a non-conductive state and the nMOSFET is in a conductive state.

In another approach, an apparatus comprises: a cross-point memory array, the cross-point memory array comprising a memory cell, the memory cell comprising an MRAM in series with a threshold switching selector; a first conductive line connected to a first end of the memory cell; a second conductive line connected to a second end of the memory cell; a first transistor pair comprising a pMOSFET in parallel with an nMOSFET and connected to the first conductive line; a second transistor pair comprising a pMOSFET in parallel with an nMOSFET and connected to the second conductive line; and a control circuit, wherein to select the memory cell, the control circuit is configured to pull up a voltage of the first conductive line via the pMOSFET but not the nMOSFET of the first transistor pair, and to pull down a voltage of the second conductive line via the nMOSFET but not the pMOSFET of the second transistor pair, and to read the memory cell, the control circuit is configured to sense a voltage of the first conductive line a first time via the nMOSFET but not the pMOSFET of the first transistor pair.

The foregoing detailed description of the invention has been presented for purposes of illustration and description. It is not intended to be exhaustive or to limit the invention to the precise form disclosed. Many modifications and variations are possible in light of the above teachings. The described approaches were chosen in order to best explain the principles of the invention and its practical application, to thereby enable others skilled in the art to best utilize the invention in various approaches and with various modifications as are suited to the particular use contemplated. It is intended that the scope of the invention be defined by the claims appended hereto.

We claim:

1. An apparatus, comprising:
   a control circuit configured to connect to a cross-point memory array, the cross-point memory array comprising a memory cell arranged between a first conductive line and a second conductive line, and a first transistor pair comprising a pMOSFET in parallel with an nMOSFET and connected to the first conductive line, the memory cell comprising a storage element in series with a threshold switching selector;
   the control circuit, to select the memory cell for a read operation, is configured to pull up a voltage of the first conductive line with the pMOSFET in a conductive state while the nMOSFET is in a non-conductive state; and
   the control circuit is configured to subsequently, in the read operation, read the memory cell while the nMOSFET is in a conductive state.

2. The apparatus of claim 1, wherein, in the read operation, the pMOSFET is in the conductive state.

3. The apparatus of claim 1, wherein a decreased resistance of the pMOSFET caused by the selecting of the memory cell is replaced by a resistance of the nMOSFET when the nMOSFET is in the conductive state.

4. The apparatus of claim 1, wherein:
   to read the memory cell, the control circuit is configured to detect a voltage on the first conductive line via the first transistor pair while the pMOSFET is in the conductive state and the nMOSFET is in the conductive state.

5. The apparatus of claim 1, wherein:
   after the selecting of the memory cell, and in preparation for the read of the memory cell, the control circuit is configured to change the nMOSFET from the non-conductive state to the conductive state and to keep the pMOSFET in the conductive state.

6. The apparatus of claim 1, wherein to read the memory cell, the control circuit is configured to:
- detect a first voltage on the first conductive line via the first transistor pair while the nMOSFET is in the conductive state, before performing a destructive write of the memory cell;
- detect a second voltage on the first conductive line via the first transistor pair while the nMOSFET is in the conductive state, after performing the destructive write of the memory cell; and
- determine a data state of the memory cell based on the first voltage and the second voltage.

7. The apparatus of claim 6, wherein:
- after the detecting of the first voltage, and in preparation for the destructive write of the memory cell, the control circuit is configured to change at least one of the nMOSFET and the pMOSFET between the conductive and non-conductive states.

8. The apparatus of claim 6, wherein:
- after the destructive write of the memory cell, and in preparation for the detecting of the second voltage, the control circuit is configured to change at least one of the nMOSFET and the pMOSFET between the conductive and non-conductive states.

9. The apparatus of claim 6, wherein:
- the control circuit is configured to keep the pMOSFET in the conductive state and the nMOSFET in the non-conductive state during the destructive write of the memory cell.

10. The apparatus of claim 6, wherein:
- the control circuit is configured to determine that the data state is a low resistance data state when the second voltage exceeds the first voltage by more than a specified amount, and to determine that the data state is a high resistance data state when the second voltage does not exceed the first voltage by more than the specified amount.

11. The apparatus of claim 6, wherein the control circuit comprises:
- a first capacitor configured to store the first voltage;
- a second capacitor configured to store an offset voltage;
- a switch configured to connect the first capacitor and the second capacitor in series; and
- a comparator configured to compare the second voltage to a voltage across the first capacitor and the second capacitor in series.

12. The apparatus of claim 1, wherein the control circuit is formed on a first die that is configured to connect to a second die that includes the cross-point memory array.

13. A method, comprising:
- switching a threshold switching selector of a memory cell from a high resistance state to a low resistance state, wherein a first conductive line is connected to a first end of the memory cell and a second conductive line connected to a second end of the memory cell, and a first transistor pair comprising a pMOSFET in parallel with an nMOSFET is connected to the first conductive line, the switching comprising setting a voltage of the first conductive line with the pMOSFET while keeping the nMOSFET in a non-conductive state; and
- while the threshold switching selector remains in the low resistance state caused by the switching, sensing a first voltage on the first conductive line via the first transistor pair while the nMOSFET is in a conductive state.

14. The method of claim 13, further comprising:
- while sensing the first voltage on the first conductive line, maintaining the pMOSFET in a conductive state.

15. The method of claim 13, further comprising:
- performing a destructive write of the memory cell to ensure the memory cell is in a high resistance state, after the sensing of the first voltage;
- sensing a second voltage on the first conductive line via the first transistor pair while the pMOSFET is in a conductive state and the nMOSFET is in the conductive state, after the performing the destructive write; and
- comparing the first voltage to the second voltage.

16. The method of claim 13, further comprising:
- performing a destructive write of the memory cell to ensure the memory cell is in a high resistance state, after the sensing of the first voltage;
- sensing a second voltage on the first conductive line via the first transistor pair while the pMOSFET is in a conductive state and the nMOSFET is in the conductive state, after the performing the destructive write; and
- comparing the first voltage to the second voltage.

17. The method of claim 16, further comprising:
- after the sensing of the first voltage, and before the destructive write of the memory cell, changing the nMOSFET from the conductive state to the non-conductive state; and
- after the destructive write of the memory cell, and before the sensing of the second voltage, changing the nMOSFET from the non-conductive state to the conductive state.

18. An apparatus, comprising:
- a cross-point memory array, the cross-point memory array comprising a memory cell, the memory cell comprising an MRAM in series with a threshold switching selector;
- a first conductive line connected to a first end of the memory cell;
- a second conductive line connected to a second end of the memory cell;
- a first transistor pair comprising a first pMOSFET in parallel with a first nMOSFET and connected to the first conductive line;
- a second transistor pair comprising a second pMOSFET in parallel with a second nMOSFET and connected to the second conductive line; and
- a control circuit, wherein to select the memory cell, the control circuit is configured to pull up a voltage of the first conductive line via the first pMOSFET of the first transistor pair, and to pull down a voltage of the second conductive line via the second nMOSFET of the second transistor pair, and to read the memory cell, the control circuit is configured to sense a voltage of the first conductive line at a first time via the first nMOSFET of the first transistor pair.

19. The apparatus of claim 18, wherein:
- to sense the voltage of the first conductive line at the first time, the control circuit is configured to pull down a voltage of the second conductive line.

20. The apparatus of claim 18, wherein:
- the cross-point memory array is formed on a first die; and
- the control circuit is formed on a second die.